United States Patent
Choi et al.

(10) Patent No.: US 10,453,745 B2
(45) Date of Patent: *Oct. 22, 2019

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Ji-Hoon Choi, Seongnam-si (KR); Jung Ho Kim, Seongnam-si (KR); Dongkyum Kim, Suwon-si (KR); Seulye Kim, Seoul (KR); Jintae Noh, Yongin-si (KR); Hyun-Jin Shin, Seoul (KR); SeungHyun Lim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/160,137

(22) Filed: May 20, 2016

(65) Prior Publication Data

US 2017/0033044 A1 Feb. 2, 2017

(30) Foreign Application Priority Data

Jul. 28, 2015 (KR) .................. 10-2015-0106278

(51) Int. Cl.
*H01L 23/522* (2006.01)
*H01L 27/115* (2017.01)
*H01L 23/528* (2006.01)
*H01L 23/532* (2006.01)
*H01L 21/768* (2006.01)
*H01L 27/11582* (2017.01)
*H01L 21/28* (2006.01)

(52) U.S. Cl.
CPC .. *H01L 21/76877* (2013.01); *H01L 27/11582* (2013.01); *H01L 21/28282* (2013.01); *H01L 23/53257* (2013.01)

(58) Field of Classification Search
None
See application file for complete search history.

(56) References Cited

U.S. PATENT DOCUMENTS

| 4,872,047 | A | 10/1989 | Fister et al. |
| 4,978,052 | A | 12/1990 | Fister et al. |
| 6,060,741 | A | 5/2000 | Huang |
| 7,952,133 | B2 | 5/2011 | Nam |
| 8,445,347 | B2* | 5/2013 | Alsmeier ............. H01L 21/764 257/316 |
| 8,723,247 | B2 | 5/2014 | Komori et al. |

(Continued)

FOREIGN PATENT DOCUMENTS

KR 2001-0061393 A 7/2001

*Primary Examiner* — Walter H Swanson
*Assistant Examiner* — Kien C Ly
(74) *Attorney, Agent, or Firm* — Lee & Morse, P.C.

(57) ABSTRACT

A semiconductor device is provided. The semiconductor device includes a stack structure comprising insulating patterns and electrode structures alternately stacked on a substrate, and a vertical channel structure vertically penetrating the stack structure. Each of the electrode structures includes a conductive pattern having a first sidewall and a second sidewall opposite to the first sidewall, a first etching prevention pattern on the first sidewall, and a second etching prevention pattern on the second sidewall.

18 Claims, 26 Drawing Sheets

(56) References Cited

U.S. PATENT DOCUMENTS

| | | | |
|---|---|---|---|
| 8,742,488 B2 | 6/2014 | Lee et al. | |
| 8,791,452 B2 | 6/2014 | Park | |
| 9,230,979 B1* | 1/2016 | Pachamuthu | H01L 27/11575 |
| 9,437,612 B1* | 9/2016 | Lee | H01L 27/11582 |
| 9,698,231 B2* | 7/2017 | Namkoong | H01L 29/42344 |
| 2007/0087505 A1 | 4/2007 | Thakur | |
| 2008/0283897 A1 | 11/2008 | Ding et al. | |
| 2012/0070944 A1* | 3/2012 | Kim | H01L 27/11578 |
| | | | 438/128 |
| 2013/0161725 A1 | 6/2013 | Park et al. | |
| 2014/0035026 A1 | 2/2014 | Jang et al. | |
| 2014/0264547 A1 | 9/2014 | Kawai et al. | |
| 2015/0249093 A1* | 9/2015 | Lee | H01L 27/11582 |
| | | | 257/324 |
| 2016/0329388 A1* | 11/2016 | Yokota | H01L 27/3246 |
| 2017/0301740 A1* | 10/2017 | Goto | H01L 27/3246 |
| 2017/0370791 A1* | 12/2017 | Nakamura | G01L 1/165 |

* cited by examiner

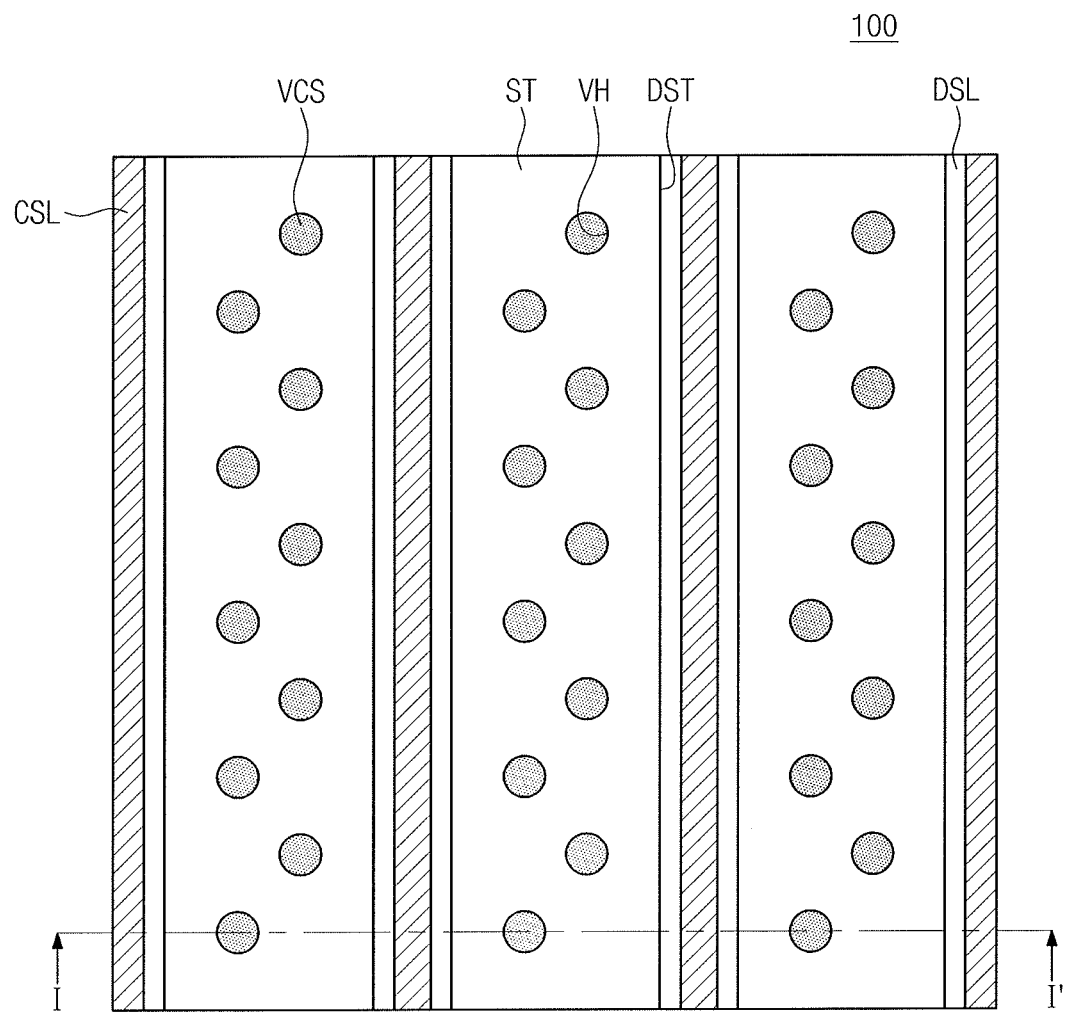

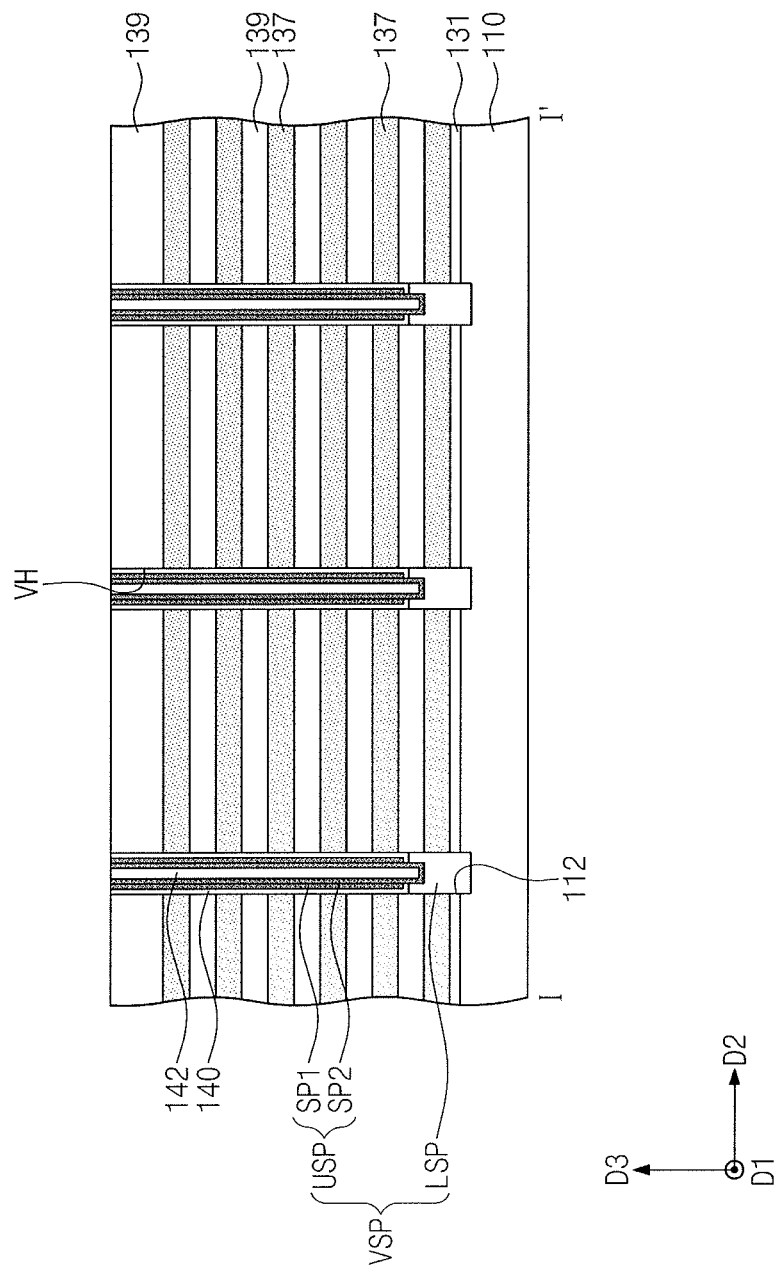

SEMICONDUCTOR DEVICE AND METHOD FOR FABRICATING THE SAME

CROSS-REFERENCE TO RELATED APPLICATION

This U.S. non-provisional patent application claims priority under 35 U.S.C. § 119 to Korean Patent Application No. 10-2015-0106278, filed on Jul. 28, 2015, in the Korean Intellectual Property Office, the disclosure of which is hereby incorporated by reference in its entirety.

BACKGROUND

Embodiments relate to a semiconductor device and a method for fabricating the same. More particularly, embodiments relate to a three-dimensional (3D) semiconductor device and a method for fabricating the same.

Semiconductor devices have been highly integrated to provide high performance and low fabrication costs. The integration density of semiconductor devices may directly affect the costs of the semiconductor devices, so highly integrated semiconductor devices have been demanded. An integration density of a conventional two-dimensional (2D) or planar memory device may be mainly determined by an area that a unit memory cell occupies. Therefore, the integration density of the conventional 2D memory device may be greatly affected by a technique of forming fine patterns. However, since extremely high-priced apparatuses are needed to form fine patterns, the integration density of 2D memory devices continues to increase but is still limited.

Three-dimensional (3D) semiconductor devices including three-dimensionally arranged memory cells have been developed to overcome the above limitations. However, production of 3D semiconductor memory devices may be expensive as compared with 2D semiconductor memory devices and may have concerns regarding providing reliable device characteristics.

SUMMARY

Embodiments may provide a semiconductor device capable of improving reliability.

Embodiments may also provide a method for fabricating a semiconductor device capable of improving reliability.

In one aspect, a semiconductor device may include a stack structure including insulating patterns and electrode structures alternately stacked on a substrate, and a vertical channel structure vertically penetrating the stack structure. Each of the electrode structures may include a conductive pattern having a first sidewall and a second sidewall opposite to the first sidewall, a first etching prevention pattern on the first sidewall, and a second etching prevention pattern on the second sidewall.

According to an embodiment, each of the insulating patterns may have a third sidewall adjacent to the first sidewall and a fourth sidewall opposite to the third sidewall. The third sidewall may be exposed by the first etching prevention pattern, and the fourth sidewall may be exposed by the second etching prevention pattern.

According to an embodiment, widths of the electrode structures may be smaller than widths of the insulating patterns.

According to an embodiment, the semiconductor device may further include a first device isolation layer covering the first etching prevention pattern, and a second device isolation layer covering the second etching prevention pattern.

The first etching prevention pattern may be disposed between the conductive pattern and the first device isolation layer, and the second etching prevention pattern may be disposed between the conductive pattern and the second device isolation layer.

According to an embodiment, the conductive pattern may be spaced apart from the first device isolation layer, and the conductive pattern may be spaced apart from the second device isolation layer.

According to an embodiment, an etch rate of the first and second etching prevention patterns by hydrofluoric acid (HF) may be lower than an etch rate of the first and second device isolation layers by hydrofluoric acid (HF).

According to an embodiment, the first etching prevention patterns may be spaced apart from each other with each of the insulating patterns interposed therebetween, and the second etching prevention patterns may be spaced apart from each other with each of the insulating patterns interposed therebetween.

According to an embodiment, the first etching prevention pattern may be in contact with the first sidewall, and the second etching prevention pattern may be in contact with the second sidewall.

According to an embodiment, the first and second etching prevention patterns may be formed of silicon or silicon nitride.

According to an embodiment, the conductive pattern may include tungsten (W).

According to an embodiment, the stack structure may include a plurality of stack structures. The plurality of stack structures may extend in a first direction, and the plurality of stack structures may be spaced apart from each other in a second direction intersecting the first direction. In this case, the semiconductor device may further include a common source region formed in the substrate between the stack structures.

According to an embodiment, the semiconductor device may further include device isolation layers covering sidewalls of the stack structures, and a common source line disposed between the device isolation layers so as to be connected to the common source region.

In another aspect, a method for fabricating a semiconductor device may include forming insulating patterns and conductive patterns alternately stacked on a substrate and a vertical channel structure penetrating the insulating patterns and the conductive patterns, forming an etching prevention layer covering sidewalls of the insulating patterns and sidewalls of the conductive patterns, forming etching prevention patterns from the etching prevention layer, the etching prevention patterns disposed on the sidewalls of the conductive patterns, respectively, and forming a device isolation layer covering the etching prevention patterns and the sidewalls of the insulating patterns. The etching prevention patterns may be spaced apart from each other.

According to an embodiment, the etching prevention layer may be formed of silicon or silicon nitride.

According to an embodiment, the etching prevention patterns may include the same material as the etching prevention layer.

According to an embodiment, the forming of the etching prevention patterns and the device isolation layer may include oxidizing a portion of the etching prevention layer. The oxidized portion of the etching prevention layer may correspond to the device isolation layer, and unoxidized portions of the etching prevention layer may correspond to the etching prevention patterns.

According to an embodiment, the forming of the etching prevention patterns may include wet-etching a portion of the etching prevention layer. The forming of the device isolation layer may include depositing a silicon oxide layer covering the etching prevention patterns and the sidewalls of the insulating patterns.

According to an embodiment, widths of the conductive patterns may be smaller than widths of the insulating patterns, and the etching prevention patterns may be disposed between the insulating patterns.

According to an embodiment, a portion of the device isolation layer may be inserted into between the insulating patterns.

According to an embodiment, the method may further include trimming the etching prevention layer before the forming of the etching prevention patterns.

BRIEF DESCRIPTION OF THE DRAWINGS

Embodiments will become more apparent in view of the attached drawings and accompanying detailed description.

FIG. 3 is a plan view illustrating a semiconductor device according to embodiments.

DETAILED DESCRIPTION OF THE EMBODIMENTS

Figure 1:
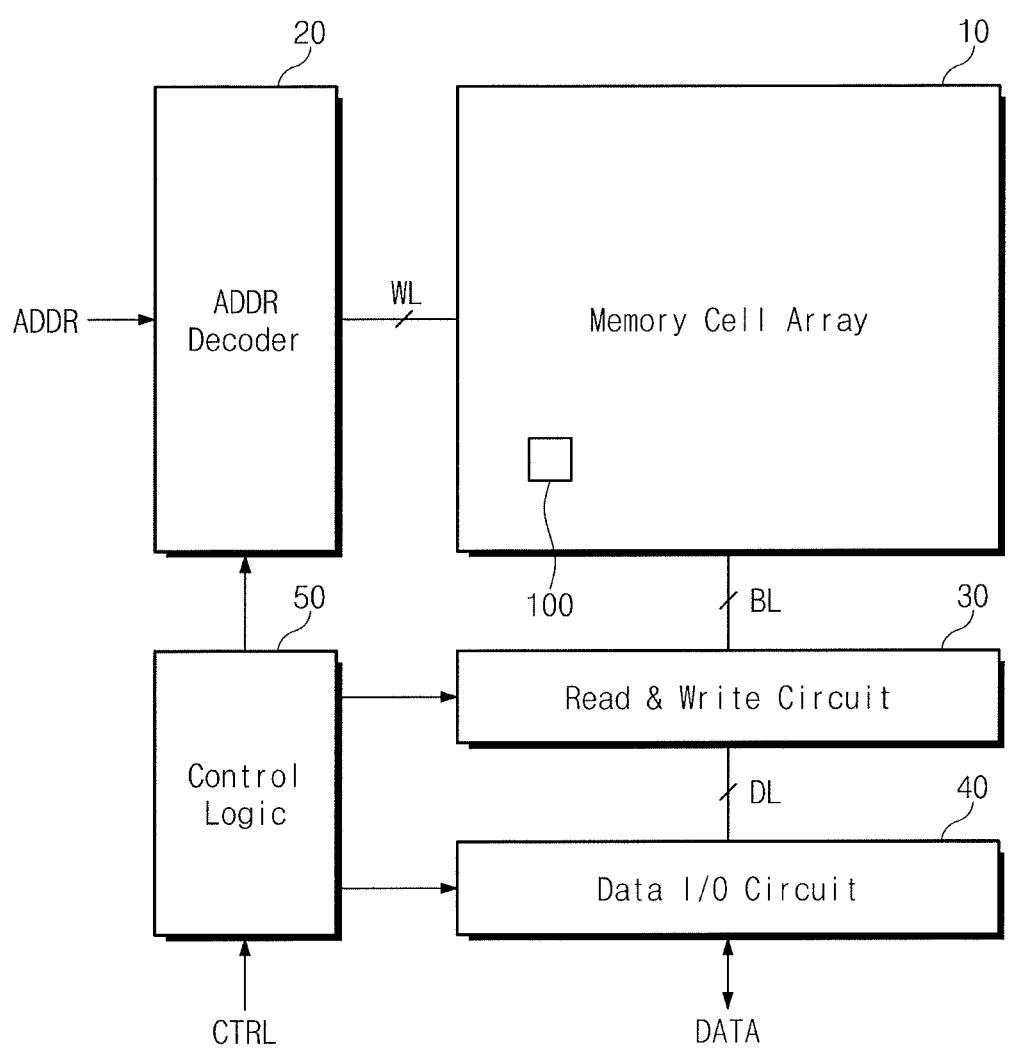
FIG. 1 is a schematic block diagram illustrating a semiconductor device according to embodiments.

Embodiments will now be described more fully hereinafter with reference to the accompanying drawings. The advantages and features of the embodiments, as well as methods of achieving them, will be apparent from the following description with reference to the accompanying drawings. It should be noted, however, that the embodiments are not limited to those described below, and may be implemented in various forms. In the drawings, embodiments are not limited to the specific examples provided therein, and may be exaggerated for clarity. The same reference numerals or the same reference designators denote the same elements throughout the specification.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments are described herein with reference to cross-sectional views and/or plan views that are idealized exemplary views. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle may, typically, have rounded or curved features. Thus, the regions illustrated in the figures are schematic in nature and their shapes are not intended to illustrate the actual shape of a region of a device and are not intended to limit the scope of the embodiments.

FIG. 1 is a schematic block diagram illustrating a semiconductor device according to embodiments. Referring to FIG. 1, a semiconductor device according to embodiments may include a memory cell array 10, an address decoder 20, a read/write circuit 30, a data input/output (I/O) circuit 40, and a control logic circuit 50.

The memory cell array 10 may be connected to the address decoder 20 through a plurality of word lines WL and may be connected to the read/write circuit 30 through a plurality of bit lines BL. The memory cell array 10 may include a plurality of memory cells. For example, the memory cell array 10 may be configured to store one or more bits in one memory cell.

The address decoder 20 may be connected to the memory cell array 10 through the word lines WL. The address decoder 20 may be configured to operate in response to a control signal of the control logic circuit 50. The address decoder 20 may receive address signals ADDR from an external system. The address decoder 20 may decode a row address signal of the received address signals ADDR to select a corresponding one of the plurality of word lines WL. In addition, the address decoder 20 may decode a column address signal of the received address signals ADDR and may transmit the decoded column address signal to the read/write circuit 30. For example, the address decoder 20 may include components such as a row decoder, a column decoder, and an address buffer.

The read/write circuit 30 may be connected to the memory cell array 10 through the bit lines BL and may be connected to the data I/O circuit 40 through data lines DL. The read/write circuit 30 may operate in response to a control signal of the control logic circuit 50. The read/write circuit 30 may be configured to receive the decoded column address signal from the address decoder 20. The read/write circuit 30 may select one of the bit lines BL by means of the decoded column address signal. For example, the read/write circuit 30 may receive data from the data I/O circuit 40 and may write the received data in the memory cell array 10. In addition, the read/write circuit 30 may read data from the memory cell array 10 and may transmit the read data to the data I/O circuit 40. The read/write circuit 30 may read data from a first storage region of the memory cell array 10 and may write the read data in a second storage region of the memory cell array 10. For example, the read/write circuit 30 may be configured to perform a copy-back operation.

The read/write circuit 30 may include components including a page buffer (or a page register) and a column selection circuit. Alternatively, the read/write circuit 30 may include components including a sense amplifier, a write driver, and the column selection circuit.

The data I/O circuit 40 may be connected to the read/write circuit 30 through the data lines DL. The data I/O circuit 40 may operate in response to a control signal of the control logic circuit 50. The data I/O circuit 40 may be configured to exchange data DATA with an external system. The data I/O circuit 40 may transmit the data DATA inputted from the external system to the read/write circuit 30 through the data lines DL. In addition, the data I/O circuit 40 may output the data DATA transmitted from the read/write circuit 30 through the data lines DL to the external system. For example, the data I/O circuit 40 may include a component such as a data buffer.

The control logic circuit 50 may be connected to the address decoder 20, the read/write circuit 30, and the data I/O circuit 40. The control logic circuit 50 may be configured to control operations of the semiconductor device. The control logic circuit 50 may operate in response to a control signal CTRL transmitted from the external system.

Figure 2:
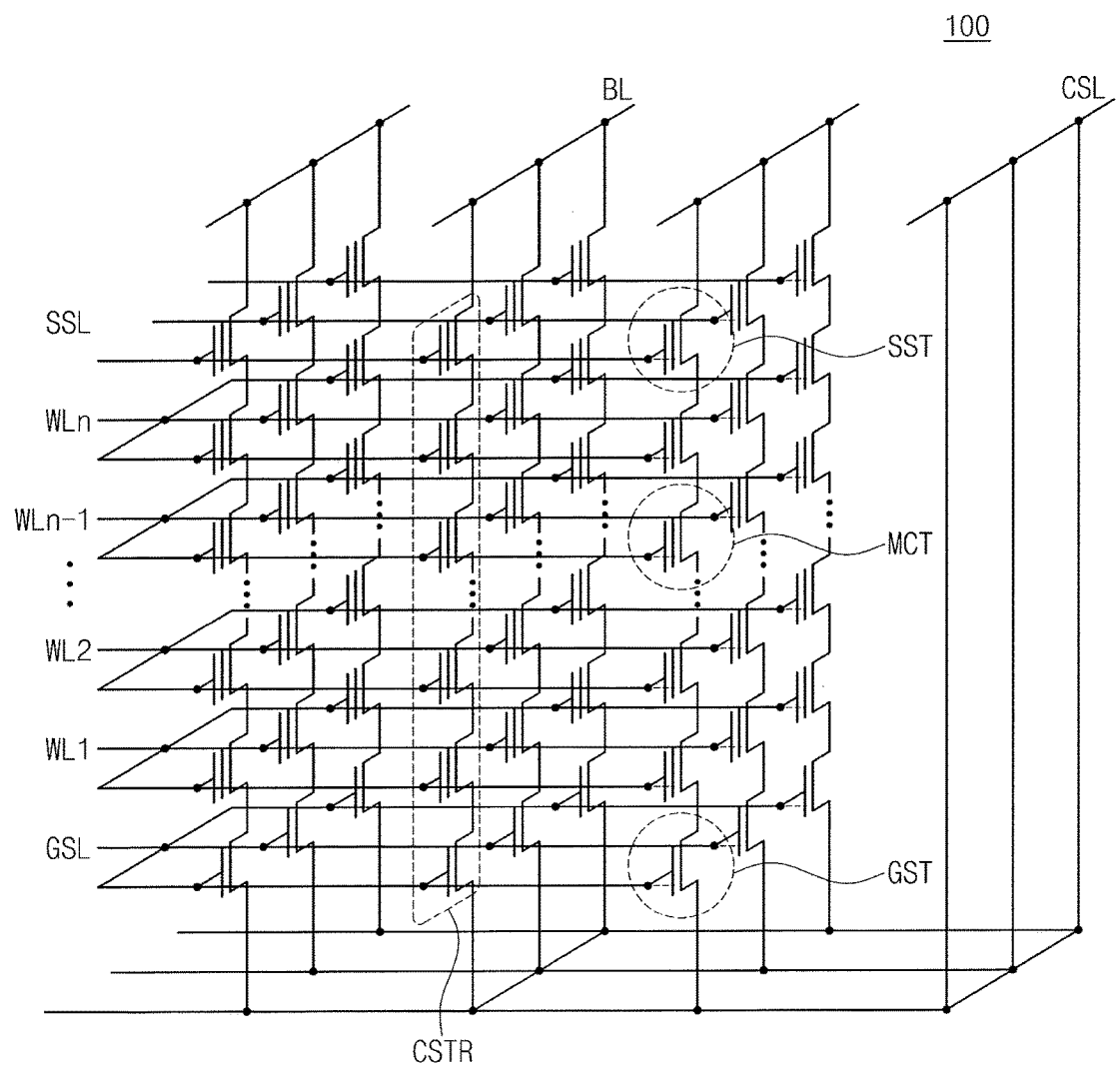
FIG. 2 is a schematic circuit diagram illustrating a cell array of a three-dimensional (3D) semiconductor memory device according to embodiments.

FIG. 2 is a schematic circuit diagram illustrating a cell array of a three-dimensional (3D) semiconductor memory device according to embodiments.

Referring to FIG. 2, a 3D semiconductor memory device according to an embodiment may include a common source line CSL, a plurality of bit lines BL, and a plurality of cell strings CSTR disposed between the common source line CSL and the bit lines BL.

The common source line CSL may be a conductive layer disposed on a substrate or a dopant region formed in a substrate. The bit lines BL may be conductive patterns (e.g., metal lines) which are spaced apart from a substrate and are disposed above the substrate. The bit lines BL may be two-dimensionally arranged and a plurality of the cell strings CSTR may be connected in parallel to each of the bit lines BL. The cell strings CSTR may be connected in common to the common source line CSL. In other words, a plurality of the cell strings CSTR may be disposed between the common source line CSL and the plurality of bit lines BL. According to some embodiments, the common source line CSL may include a plurality of common source lines CSL two-dimensionally arranged. In an embodiment, the same voltage may be applied to the common source lines CSL. In an embodiment, the common source lines CSL may be electrically controlled independently of each other.

Each of the cell strings CSTR may include a ground selection transistor GST connected to the common source line CSL, a string selection transistor SST connected to one of the bit lines BL, and a plurality of memory cell transistors MCT connected between the ground and string selection transistors GST and SST. The ground selection transistor GST, the memory cell transistors MCT, and the string selection transistor SST may be connected in series in the order named.

The common source line CSL may be connected in common to sources of the ground selection transistors GST. A ground selection line GSL, a plurality of word lines WL1 to WLn, and a string selection line SSL, which are disposed between the common source line CSL and the bit lines BL, may correspond to gate electrodes of the ground selection transistor GST, the memory cell transistors MCT, and the string selection transistor SST, respectively. Each of the memory cell transistors MCT may include a data storage element.

Figure 4A:
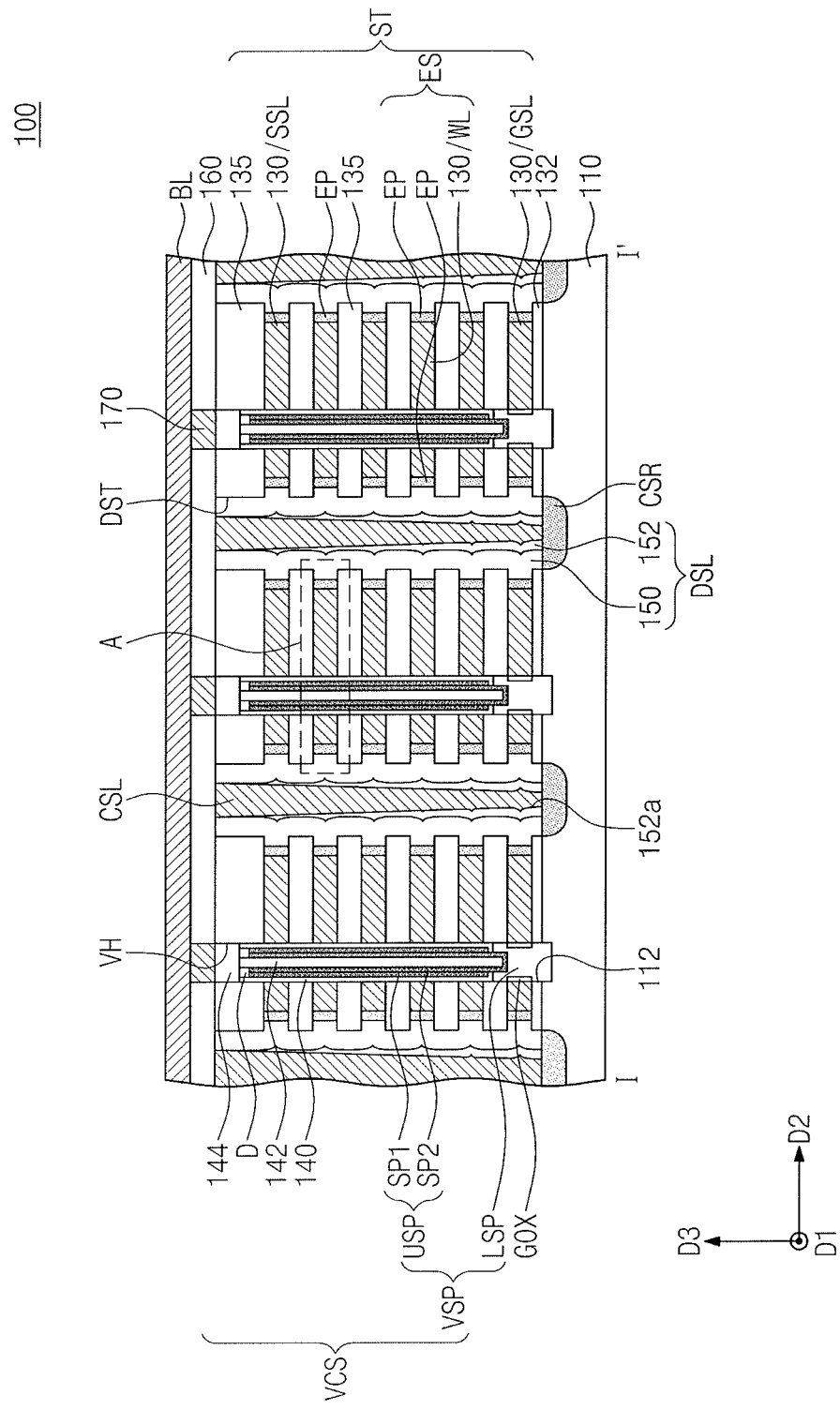
FIG. 4A is a cross-sectional view taken along a line I-I' of FIG. 3 to illustrate a semiconductor device according to embodiments.
Figure 4B:
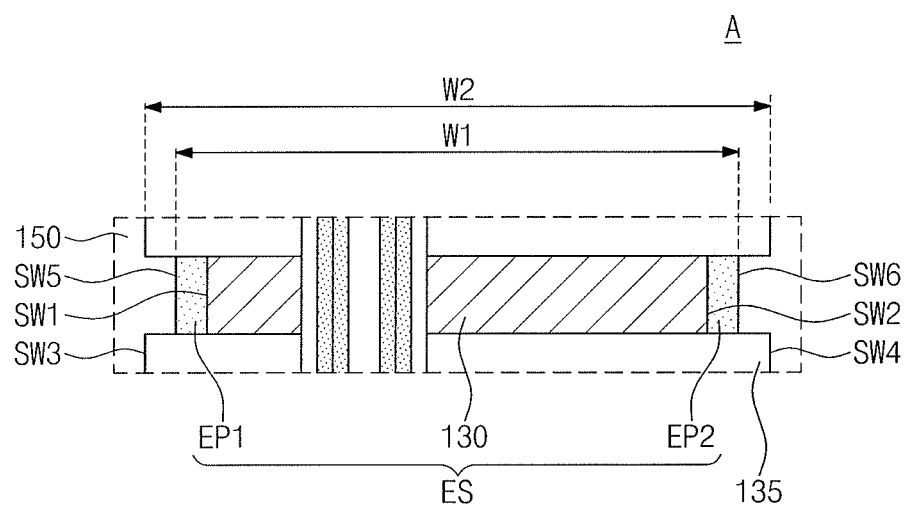
FIG. 4B is an enlarged view of a portion 'A' of FIG. 4A.

FIG. 3 is a plan view illustrating a semiconductor device according to embodiments. FIG. 4A is a cross-sectional view taken along a line I-I' of FIG. 3 to illustrate a semiconductor device according to embodiments. FIG. 4B is an enlarged view of a portion 'A' of FIG. 4A.

Referring to FIGS. 3, 4A, and 4B, a semiconductor device 100 may include a substrate 110, stack structures ST, vertical channel structures VCS, and bit lines BL.

The substrate 110 may be a semiconductor substrate. For example, the semiconductor substrate may include a single-crystalline silicon layer, a silicon layer formed on a silicon-germanium (SiGe) layer, a single-crystalline silicon layer formed on an insulating layer, or a poly-crystalline semiconductor layer formed on an insulating layer.

The stack structures ST may be disposed between the substrate 110 and the bit line BL. Each of the stack structures ST may extend in a first direction D1 when viewed from a plan view. The stack structures ST may be spaced apart from each other in a second direction D2 intersecting (e.g., perpendicular to) the first direction D1 by device isolation trenches DST extending in the first direction D1. Portions of a top surface of the substrate 110 may be exposed through the device isolation trenches DST. Each of the stack structures ST may include electrode structures ES and insulating patterns 135 which are alternately and repeatedly stacked on the substrate 110.

Each of the electrode structures ES may include a conductive pattern 130 and a pair of etching prevention patterns EP respectively disposed on both sidewalls of the conductive pattern 130. In more detail, as illustrated in FIG. 4B, each of the electrode structures ES may include the conductive pattern 130, a first etching prevention pattern EP1, and a second etching prevention pattern EP2. The conductive pattern 130 may have a first sidewall SW1 and a second sidewall SW2 opposite to the first sidewall SW1. The first etching prevention pattern EP1 may be disposed on the first sidewall SW1, and the second etching prevention pattern EP2 may be disposed on the second sidewall SW2. In addition, the first etching prevention pattern EP1 may be in contact with the first sidewall SW1, and the second etching prevention pattern EP2 may be in contact with the second sidewall SW2.

The first and second etching prevention patterns EP1 and EP2 may be locally disposed on the sidewalls SW1 and SW2 of the conductive pattern 130 and may not extend onto sidewalls SW3 and SW4 of the insulating patterns 135. Thus, the first etching prevention patterns EP1 may be spaced apart from each other with the insulating patterns 135 interposed therebetween. Likewise, the second etching prevention patterns EP2 may be spaced apart from each other with the insulating patterns 135 interposed therebetween.

The conductive pattern 130 may include a conductive material, e.g., tungsten (W). The first and second etching prevention patterns EP1 and EP2 may be formed of a material, an etch rate of which is lower than that of device isolation layers DSL, to be described later, with respect to hydrofluoric acid (HF). In other words, the etch rate of the first and second etching prevention patterns EP1 and EP2 by hydrofluoric acid may be lower than the etch rate of the device isolation layers DSL by hydrofluoric acid. For example, the first and second etching prevention patterns EP1 and EP2 may be formed of silicon or silicon nitride.

The conductive pattern 130/GSL included in the lowermost electrode structure ES may be a ground selection line, and the conductive pattern 130/SSL included in the uppermost electrode structure ES may be a string selection line. The conductive patterns 130/WL included in the electrode structures ES disposed between the ground and string selection lines may be word lines. A buffer dielectric pattern 132 may be provided between the substrate 110 and the ground selection line 130/GSL. The buffer dielectric pattern 132 may be thinner than the insulating patterns 135. For example, the buffer dielectric pattern 132 may include silicon oxide.

Each of the insulating patterns 135 may have a third sidewall SW3 adjacent to the first sidewall SW1 and a fourth sidewall SW4 opposite to the third sidewall SW3. The third sidewall SW3 may be exposed by the first etching prevention patterns EP1, and the fourth sidewall SW4 may be exposed by the second etching prevention patterns EP2. For example, the insulating patterns 135 may include silicon oxide.

According to some embodiments, as illustrated in FIGS. 4A and 4B, a width W1 in the second direction D2 of the electrode structure ES may be smaller than a width W2 in the second direction D2 of the insulating pattern 135. In this case, an outer sidewall SW5 of the first etching prevention pattern EP1 may be laterally recessed as compared with the third sidewalls SW3 of the insulating patterns 135. Likewise, an outer sidewall SW6 of the second etching prevention pattern EP2 may be laterally recessed as compared with the fourth sidewalls SW4 of the insulating patterns 135. The conductive pattern 130 and the first and second etching prevention patterns EP1 and EP2 may be disposed between a pair of the insulating patterns 135 vertically adjacent to each other.

Figure 4C:
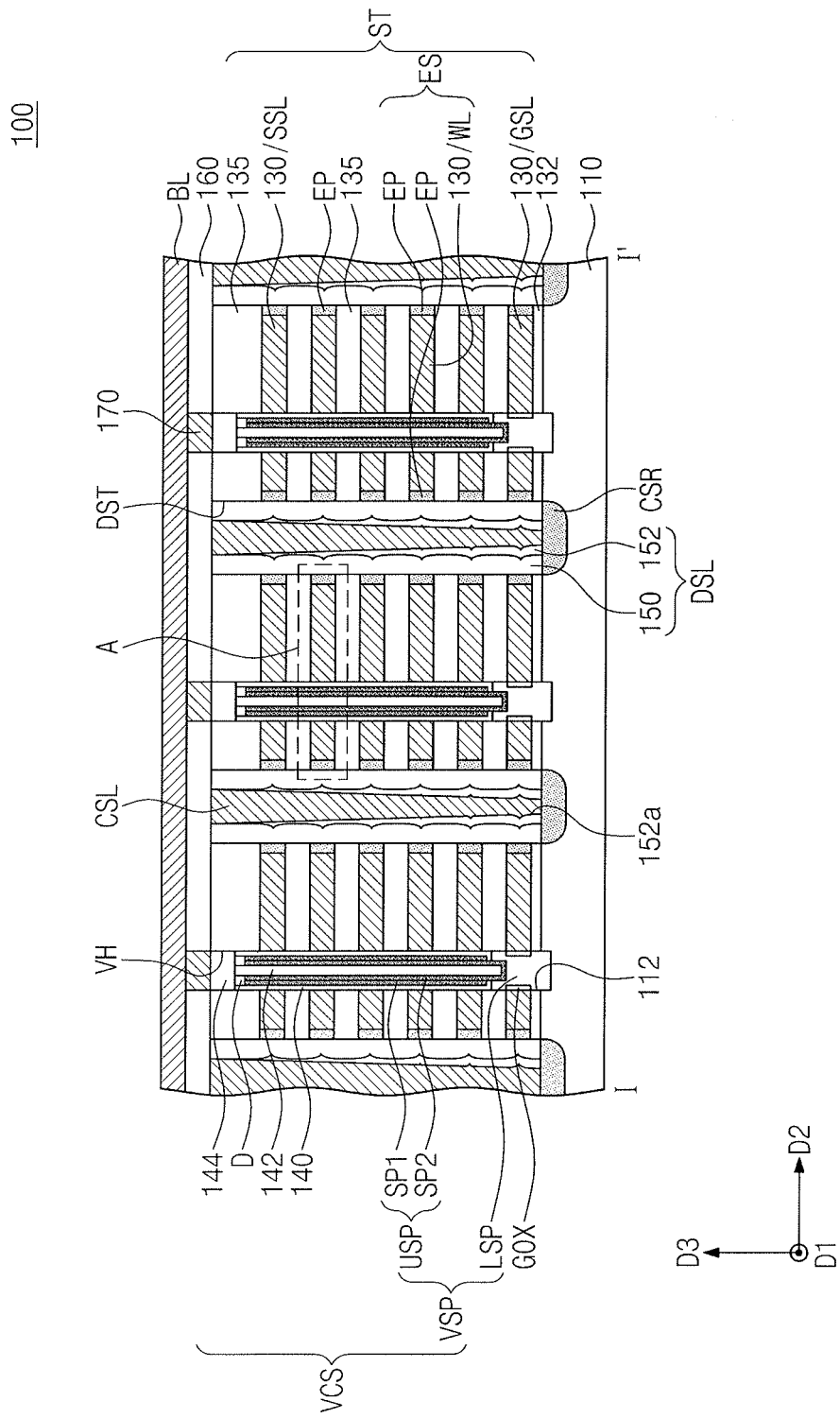
FIG. 4C is a cross-sectional view taken along the line I-I' of FIG. 3 to illustrate a semiconductor device according to embodiments.
Figure 4D:
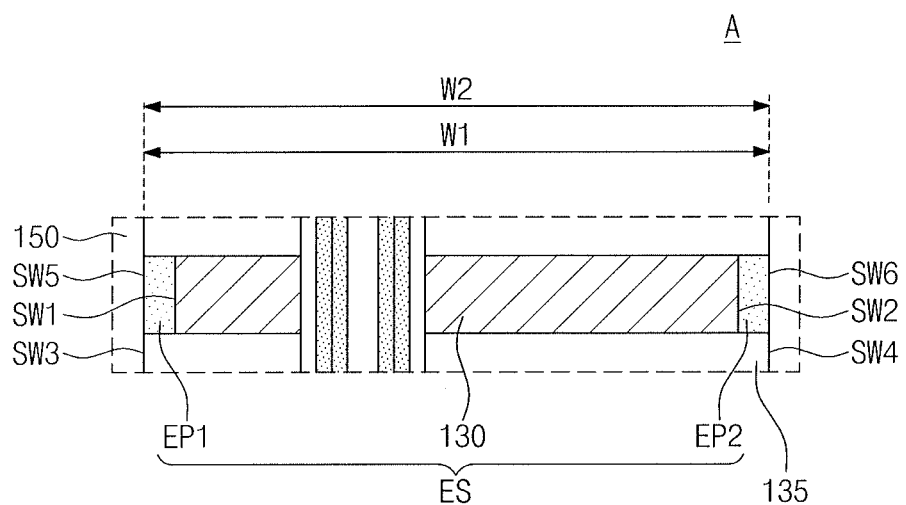
FIG. 4D is an enlarged view of a portion 'A' of FIG. 4C.

Alternatively, as illustrated in FIGS. 4C and 4D, the width W1 in the second direction D2 of the electrode structure ES may be substantially equal to the width W2 in the second direction D2 of the insulating pattern 135. In this case, the outer sidewall SW5 of the first etching prevention pattern EP1 may be substantially coplanar with the third sidewalls SW3 of the insulating patterns 135. Likewise, the outer sidewall SW6 of the second etching prevention pattern EP2 may be substantially coplanar with the fourth sidewalls SW4 of the insulating patterns 135. The conductive pattern 130 and the first and second etching prevention patterns EP1 and EP2 may be disposed between a pair of the insulating patterns 135 vertically adjacent to each other.

Each of the stack structures ST may have vertical holes VH that penetrate the conductive patterns 130 to expose the substrate 110. According to some embodiments, the substrate 110 under the vertical holes VH may be recessed, and thus, the vertical holes VH may extend to the recessed surfaces of the substrate 110. In other words, a recess region 112 may be formed in an upper portion of the substrate 10 under each of the vertical holes VH. As illustrated in FIG. 3, the vertical holes VH penetrating each of the stack structures ST may be arranged in a zigzag form along the first direction D1. However, embodiments are not limited thereto. The arrangement of the vertical holes VH may be variously modified.

The vertical channel structures VCS may be provided to fill the vertical holes VH, respectively. Each of the vertical channel structures VCS may include a vertical semiconductor pattern VSP, a data storage structure 140, a filling insulator 142, and a conductive pad 144.

The vertical semiconductor pattern VSP may include a lower semiconductor pattern LSP and an upper semiconductor pattern USP. The lower semiconductor pattern LSP may be provided in a lower region of the vertical hole VH and may be in contact with the substrate 110. The lower semiconductor pattern LSP may have a pillar shape that fills the recess region 112 formed in the substrate 110 and the lower region of the vertical hole VH. A top surface of the lower semiconductor pattern LSP may be disposed at a higher level than a top surface of the lowermost conductive pattern 130/GSL, and a bottom surface of the lower semiconductor pattern LSP may be disposed at a lower level than the topmost surface of the substrate 110. A gate insulating layer GOX may be provided between the lower semiconductor pattern LSP and the lowermost conductive pattern 130/GSL. The gate insulating layer GOX may include, for example, silicon oxide. The lower semiconductor pattern LSP may include silicon formed by performing a selective epitaxial growth (SEG) process using the substrate 110 exposed by the vertical hole VH as a seed.

The upper semiconductor pattern USP may be disposed on the lower semiconductor pattern LSP. The upper semiconductor pattern USP may be electrically connected to the substrate 110 through the lower semiconductor pattern LSP.

The upper semiconductor pattern USP may extend in a third direction D3 perpendicular to the substrate 110. A first end (e.g., a bottom end) of the upper semiconductor pattern USP may be connected to the lower semiconductor pattern LSP, and a second end (e.g., a top end) of the upper semiconductor pattern USP may be connected to the bit line BL to be described later in more detail. A conductive pad 144 may be provided on the second end (e.g., the top end) of the upper semiconductor pattern USP. The conductive pad 144 may include doped poly-crystalline silicon or a metal. A portion of the upper semiconductor pattern USP, which is in contact with the conductive pad 144, may correspond to a drain region D. The drain region D may be formed by doping a portion of the upper semiconductor pattern USP with dopants. The upper semiconductor pattern USP may have a hollow pipe shape or a hollow macaroni shape. A bottom end of the upper semiconductor pattern USP may be in a closed state. An inner space of the upper semiconductor pattern USP may be filled with the filling insulator 142. A bottom surface of the upper semiconductor pattern USP may be disposed at a lower level than the top surface of the lower semiconductor pattern LSP. In other words, a portion of the top surface of the lower semiconductor pattern LSP may be recessed, and a bottom end portion of the upper semiconductor pattern USP may be disposed in the recessed region of the top surface of the lower semiconductor pattern LSP. That is, the bottom end portion of the upper semiconductor pattern USP may be surrounded by the lower semiconductor pattern LSP.

In more detail, the upper semiconductor pattern USP may include a first semiconductor pattern SP1 and a second semiconductor pattern SP2. The first semiconductor pattern SP1 may be disposed on an inner sidewall of the vertical hole VH, and the second semiconductor pattern SP2 may be disposed on an inner sidewall of the first semiconductor pattern SP1. The first semiconductor pattern SP1 may have a pipe or macaroni shape that has an opened top end and an opened bottom end. The first semiconductor pattern SP1 may not be in contact with the lower semiconductor pattern LSP and may be spaced apart from the lower semiconductor pattern LSP. The second semiconductor pattern SP2 may have a pipe or macaroni shape having a closed bottom end. An inner space of the second semiconductor pattern SP2 may be filled with the filling insulator 142. The second semiconductor pattern SP2 may be in contact with the lower semiconductor pattern LSP. In addition, a portion (e.g., a bottom end portion) of the second semiconductor pattern SP2 may be disposed in the recessed region of the top surface of the lower semiconductor pattern LSP. The second semiconductor pattern SP2 may electrically connect the first semiconductor pattern SP1 to the lower semiconductor pattern LSP.

The data storage structure 140 may be disposed between the upper semiconductor pattern USP and one or more of the conductive patterns 130. The data storage structure 140 may include a blocking insulating layer adjacent to the conductive pattern 130, a tunnel insulating layer adjacent to the upper semiconductor pattern USP, and a charge storage layer disposed between the blocking insulating layer and the tunnel insulating layer. For example, the tunnel insulating layer may include silicon oxide. For example, the charge storage layer may include at least one of silicon nitride, silicon oxynitride, silicon-rich nitride, nano-crystalline silicon, or a laminated trap layer. The blocking insulating layer may include a material having a greater energy band gap than the charge storage layer. For example, the blocking insulating layer may include at least one of a silicon oxide layer, a silicon nitride layer, a silicon oxynitride layer, or a high-k dielectric layer.

Common source regions CSR may be provided in upper portions of the substrate 110 exposed through the device isolation trenches DST. The common source regions CSR may have a substantially uniform depth. The common source regions CSR may be portions of the substrate 110 which are doped with dopants. The common source regions CSR may extend in the first direction D1 and may be spaced apart from each other in the second direction D2. The stack structures ST and the common source regions CSR may be alternately and repeatedly arranged in the second direction D2 when viewed from a plan view.

The device isolation layers DSL covering sidewall of the stack structures ST may be provided in the device isolation trenches DST, respectively. Some of the device isolation layers DSL may cover sidewalls of the stack structures ST which have the outer sidewalls SW5 of the first etching prevention patterns EP1 and the third sidewalls SW3, and others of the device isolation layers DSL may cover sidewalls of the stack structures ST which have the outer sidewalls SW6 of the second etching prevention patterns EP2 and the fourth sidewalls SW4. Thus, the first and second etching prevention patterns EP1 and EP2 may be disposed between the conductive pattern 130 and the device isolation layers DSL respectively disposed at both sides of each of the stack structures ST. In other words, the device isolation layer DSL and the conductive pattern 130 may be spaced apart from each other with the first or second etching prevention pattern EP1 or EP2 interposed therebetween.

The device isolation layers DSL may include silicon oxide. For example, the device isolation layer DSL may include a silicon oxide layer formed by oxidizing silicon or a silicon oxide layer deposited at a high temperature (e.g., a temperature of about 100 degrees Celsius to about 900 degrees Celsius).

According to embodiments, each of the device isolation layers DSL may include a multi-layer. For example, as illustrated in FIG. 4A, each of the device isolation layers DSL may include a first device isolation layer 150 covering each of the sidewalls of the stack structures ST, and a second device isolation layer 152 disposed on the first device isolation layer 150. According to some embodiments, as illustrated in FIG. 4A, a lower portion 152a of a sidewall of the second device isolation layer 152 may be uneven. However, embodiments are not limited thereto. According to other embodiments, unlike FIG. 4A, the lower portion 152a of the sidewall of the second device isolation layer 152 may be even.

Common source lines CSL may be provided in the device isolation trenches DST, respectively. Each of the common source lines CSL may be disposed between the device isolation layers DSL disposed in corresponding one of the device isolation trenches DST and may be connected to the common source region CSR. The common source lines CSL may include a conductive material (e.g., tungsten (W)).

An interlayer insulating layer 160 may be provided to cover the stack structures ST and device isolation layers DSL. For example, the interlayer insulating layer 160 may include at least one of silicon oxide, silicon nitride, or silicon oxynitride.

The bit line BL may be provided on the interlayer insulating layer 160 to intersect the stack structures ST. The bit line BL may extend in the second direction D2 and may include a conductive material. The bit line BL may be electrically connected to the conductive pads 144 through contact plugs 170 penetrating the interlayer insulating layer 160.

Hydrofluoric acid (HF) may be generated in a process of forming the conductive pattern 130 including tungsten. For example, when the tungsten layer is formed, tungsten hexafluoride ($WF_6$) and hydrogen ($H_2$) which are used as source gases may react with each other to generate a hydrofluoric acid (HF) gas. In a general semiconductor device which does not include the etching prevention patterns EP1 and EP2, hydrofluoric acid (HF) may be trapped in the conductive pattern 130 and may be then diffused into the device isolation layer DSL, and thus the device isolation layer DSL may be etched by the hydrofluoric acid (HF).

However, in the semiconductor device 100 according to embodiments, the device isolation layer DSL and the conductive pattern 130 may be spaced apart from each other with the first or second etching prevention pattern EP1 or EP2 interposed therebetween. The first and second etching prevention patterns EP1 and EP2 may be formed of a material having a high etch resistance with respect to hydrofluoric acid (HF) (i.e., a material having a low etch rate with respect to the hydrofluoric acid (HF)). Thus, it is possible to inhibit the hydrofluoric acid (HF) from being diffused from the conductive pattern 130 into the device isolation layer DSL. As a result, reliability of the semiconductor device 100 according to embodiments may be improved.

Figure 5A:
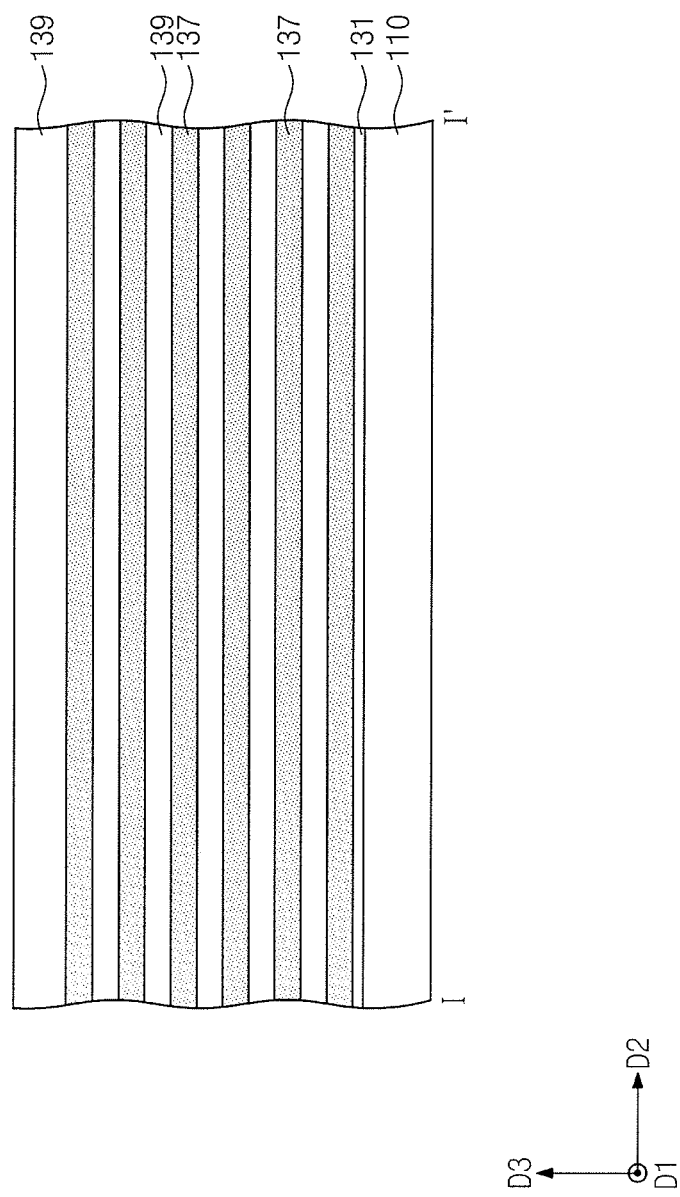
FIGS. 5A to 5O are cross-sectional views corresponding to the line I-I' of FIG. 3 to illustrate stages in a method for fabricating a semiconductor device according to embodiments.

FIGS. 5A to 5O are cross-sectional views corresponding to the line I-I' of FIG. 3 to illustrate a method for fabricating a semiconductor device according to embodiments. Hereinafter, the same elements as described with reference to FIGS. 3, 4A, and 4B will be indicated by the same reference numerals or the same reference designators. For the purpose of ease and convenience in explanation, the same descriptions as mentioned with reference to FIGS. 3, 4A, and 4C will be omitted or mentioned briefly.

Referring to FIGS. 3 and 5A, a buffer dielectric layer 131 may be formed on a substrate 110. The buffer dielectric layer 131 may include, for example, silicon oxide and may be formed by a thermal oxidation process. The buffer dielectric layer 131 may be thinner than insulating layers 139 to be described later.

Sacrificial layers 137 and insulating layers 139 may be alternately and repeatedly formed on the buffer dielectric layer 131. The uppermost insulating layer 139 may be thicker than other insulating layers 139. The sacrificial layers 137 may include a material having an etch selectivity with respect to the buffer dielectric layer 131 and the insulating layers 139. For example, the insulating layers 139 may include silicon oxide. In this case, the sacrificial layers 137 may include at least one of, but not limited to, silicon nitride, silicon oxynitride, poly-crystalline silicon, or poly-crystalline silicon-germanium. Each of the sacrificial layers 137 and the insulating layers 139 may be formed by, for example, a chemical vapor deposition (CVD) method.

Figure 5B:
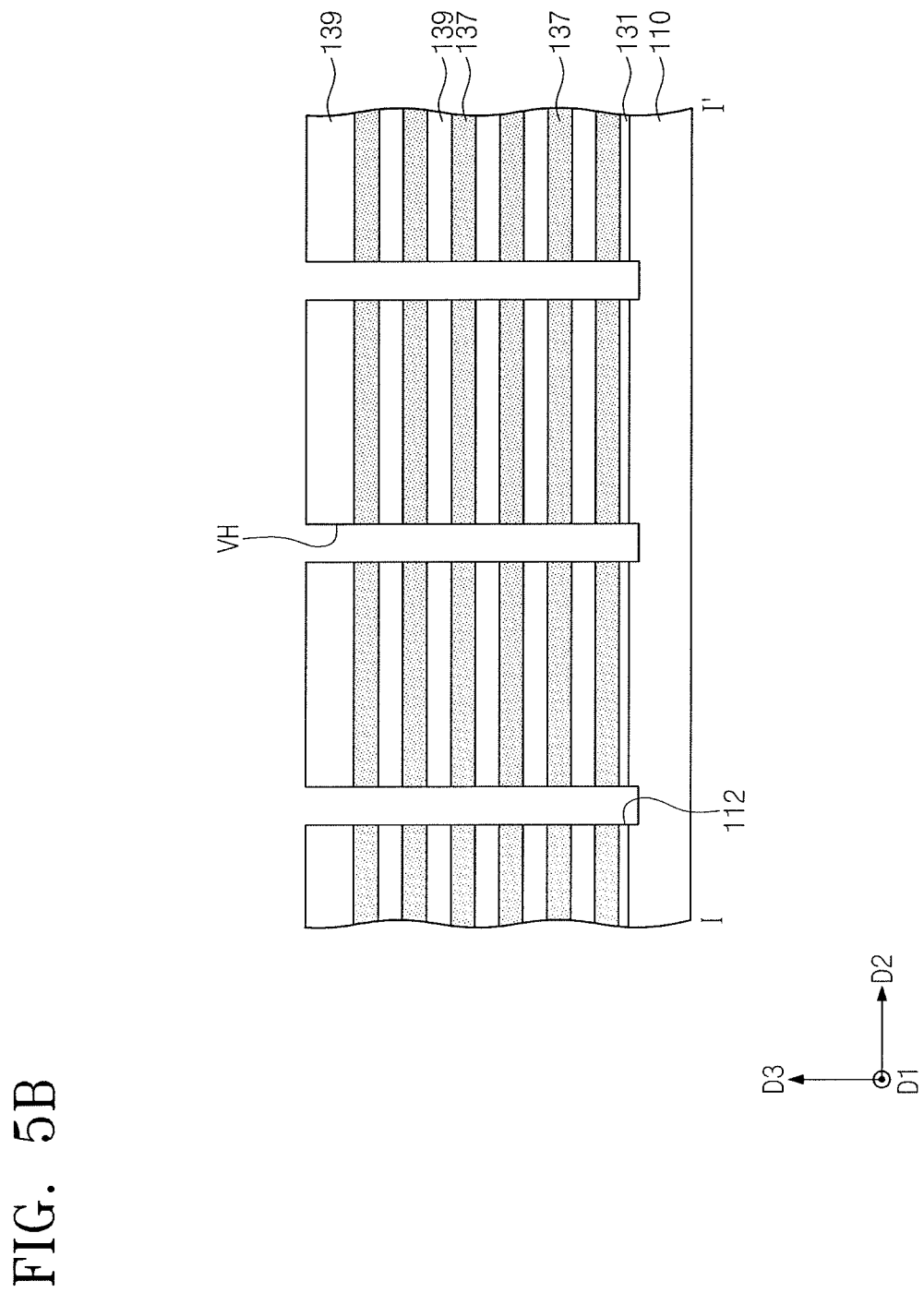

Referring to FIGS. 3 and 5B, vertical holes VH may be formed to penetrate the insulating layers 139, the sacrificial layers 137, and the buffer dielectric layer 131. The vertical holes VH may expose the substrate 110. Forming the vertical holes VH may include performing an anisotropic etching process. A top surface of the substrate 110 under the vertical holes VH may be recessed by the anisotropic etching process, and thus recess regions 112 may be formed in an upper portion of the substrate 110 under the vertical holes VH.

Figure 5C:
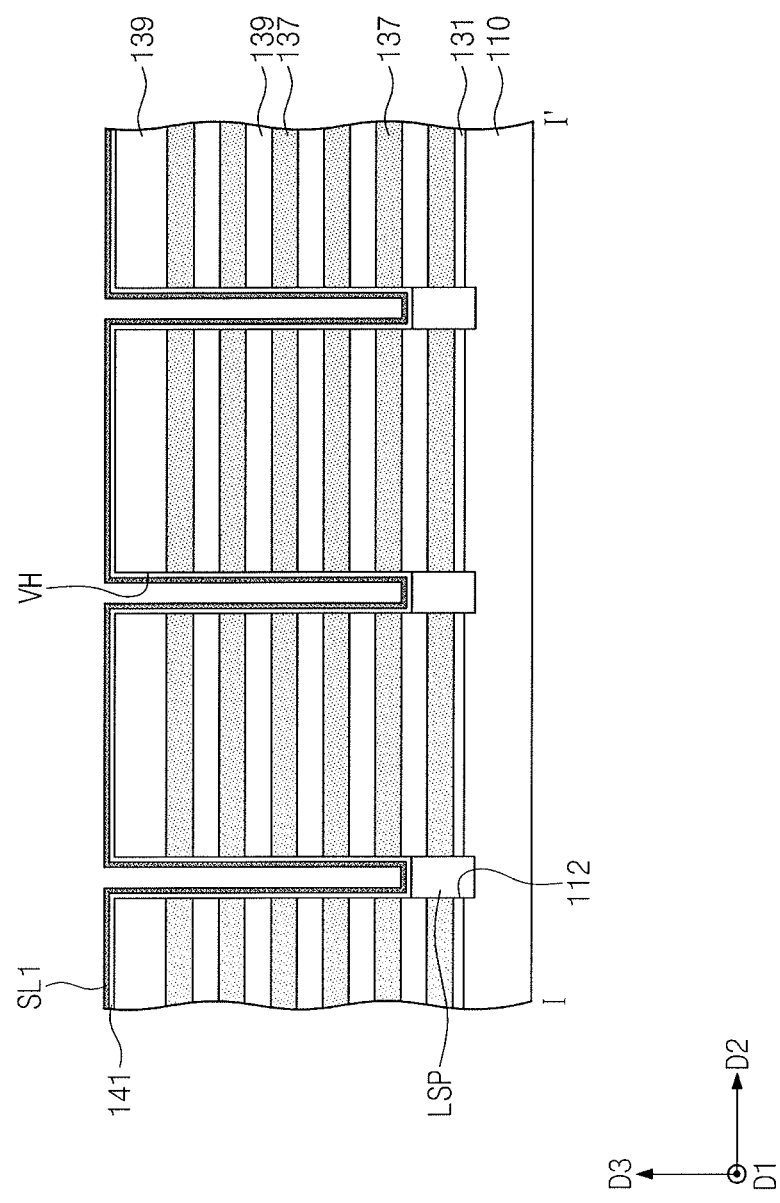

Referring to FIGS. 3 and 5C, a lower semiconductor pattern LSP may be formed to fill a lower region of each of the vertical holes VH. Forming the lower semiconductor pattern LSP may include performing a selective epitaxial growth (SEG) process using the substrate 110 exposed by the vertical hole VH as a seed. The lower semiconductor pattern LSP may fill the recess region 112 and may protrude from the top surface of the substrate 110. A top surface of the lower semiconductor pattern LSP may be disposed at a level between a top surface of the lowermost sacrificial layer 137 and a bottom surface of the next lowermost sacrificial layer 137 disposed on the lowermost sacrificial layer 137. The lower semiconductor pattern LSP may include silicon or silicon-germanium.

A data storage layer 141 and a first semiconductor layer SL1 may be sequentially formed on inner sidewalls of the vertical holes VH. The data storage layer 141 and the first semiconductor layer SL1 may extend on the top surface of the lower semiconductor pattern LSP and a top surface of the uppermost insulating layer 139. In other words, the data storage layer 141 and the first semiconductor layer SL1 may be conformally formed in the vertical holes VH and on the uppermost insulating layer 139.

Forming the data storage layer 141 may include sequentially forming a blocking insulating layer (not shown), a charge storage layer (not shown), and a tunnel insulating layer (not shown). The blocking insulating layer may include a material having a greater energy band gap than the charge storage layer. For example, the blocking insulating layer may include at least one of a silicon oxide layer, a silicon nitride layer, a silicon oxynitride layer, a high-k dielectric layer. For example, the charge storage layer may include at least one of silicon nitride, silicon oxynitride, silicon-rich nitride, nano-crystalline silicon, or a laminated trap layer. For example, the tunnel insulating layer may include silicon oxide. Each of the blocking insulating layer, the charge storage layer and the tunnel insulating layer may be formed by a CVD process or an atomic layer deposition (ALD) process.

The first semiconductor layer SL1 may be formed to conformally cover the data storage layer 141. The first semiconductor layer SL1 may cover the data storage layer 141 and top surfaces of the lower semiconductor patterns LSP in the vertical holes VH and may extend onto the uppermost insulating layer 139. The first semiconductor layer SL1 may be formed using a CVD process or an ALD process.

Figure 5D:
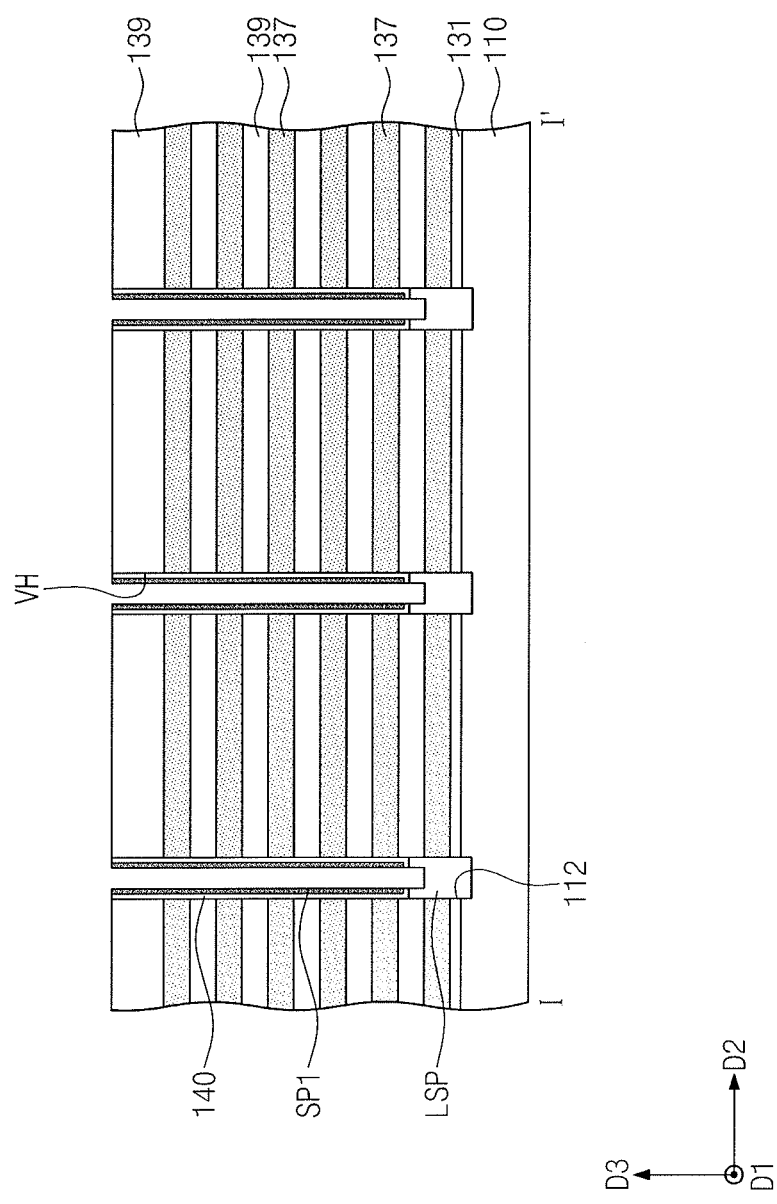

Referring to FIGS. 3 and 5D, the data storage layer 141 of FIG. 5C and the first semiconductor layer SL1 of FIG. 5C may be patterned to form a data storage structure 140 and a first semiconductor pattern SP1 in each of the vertical holes VH. Forming the data storage structure 140 and the first semiconductor pattern SP1 may include anisotropically etching the data storage layer 141 and the first semiconductor layer SL1. The anisotropic etching process may be performed until the top surface of the uppermost insulating layer 139 is exposed. The lower semiconductor pattern LSP may also be exposed by the anisotropic etching process. In addition, an upper portion of the lower semiconductor pattern LSP may be partially recessed by the anisotropic etching process.

Referring to FIGS. 3 and 5E, a second semiconductor pattern SP2 and a filling insulator 142 may be formed in each of the vertical holes VH. Forming the second semiconductor pattern SP2 may include forming a second semiconductor layer (not shown) conformally covering the structure described with reference to FIGS. 3 and 5D, and planarizing the second semiconductor layer. The second semiconductor layer may be formed using a CVD process or an ALD process. Forming the filling insulator 142 may include forming a filling insulation layer filling the vertical holes VH and planarizing the filling insulation layer. In an embodiment, planarizing the second semiconductor layer and planarizing the filling insulation layer may be performed at the substantially same time. In other words, the filling insulation layer may be formed on the second semiconductor layer, and then, the filling insulation layer and the second semiconductor layer may be planarized until the uppermost insulating layer 139 is exposed, thereby forming the second semiconductor pattern SP2 and the filling insulator 142. The first and second semiconductor patterns SP1 and SP2 in each of the vertical holes VH may constitute an upper semiconductor pattern USP, and the upper and lower semiconductor patterns USP and LSP in each of the vertical holes VH may constitute a vertical semiconductor pattern VSP.

Figure 5F:
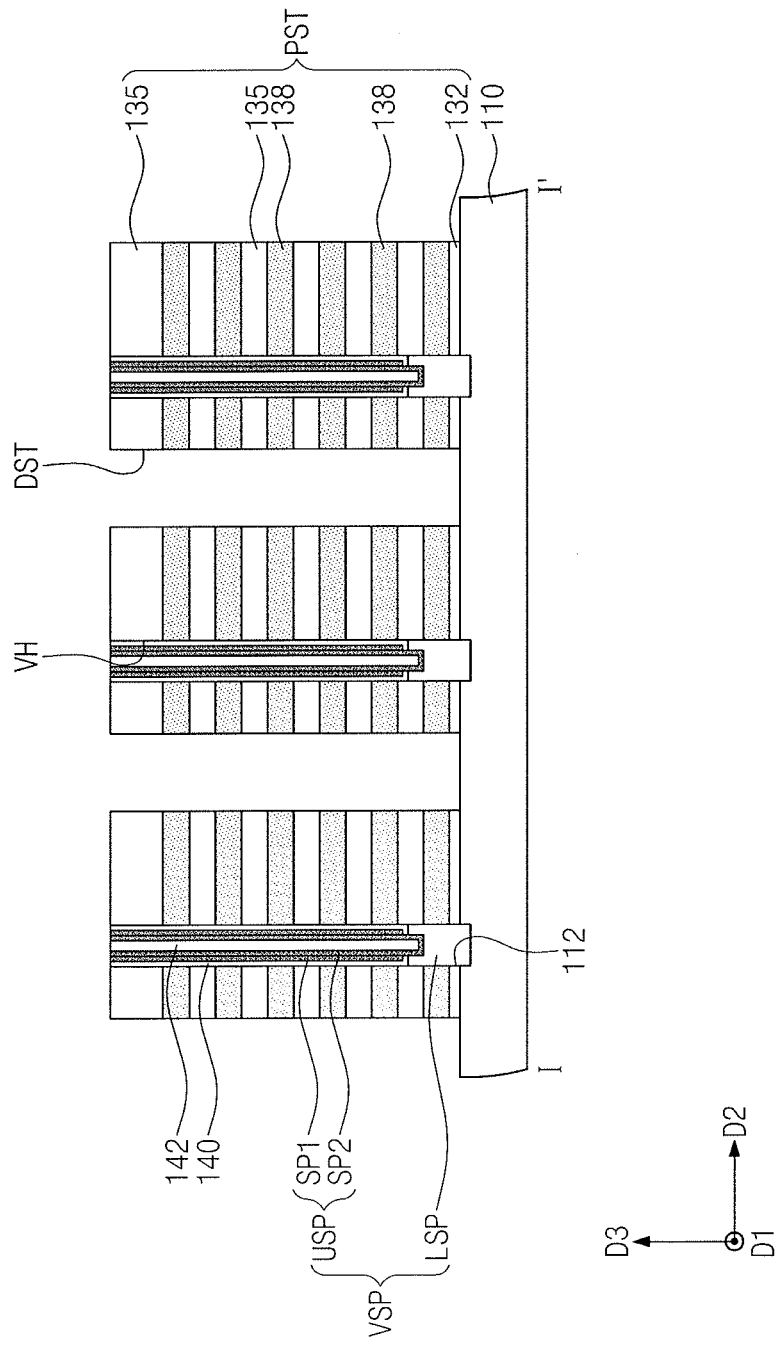

Referring to FIGS. 3 and 5F, device isolation trenches DST may be formed to define preliminary stack structures PST. Forming the device isolation trenches DST may include sequentially patterning the insulating layers 139, the sacrificial layers 137, and the buffer dielectric layer 131 of FIG. 5E. The device isolation trenches DST may extend in a first direction D1 and may be spaced apart from each other in a second direction D2.

Each of the preliminary stack structures PST may include a buffer dielectric pattern 132, insulating patterns 135, and sacrificial patterns 138. The preliminary stack structures PST may be spaced apart from each other in the second direction D2 by the device isolation trenches DST. The preliminary stack structures PST may extend in the first direction D1 when viewed from a plan view.

Figure 5G:
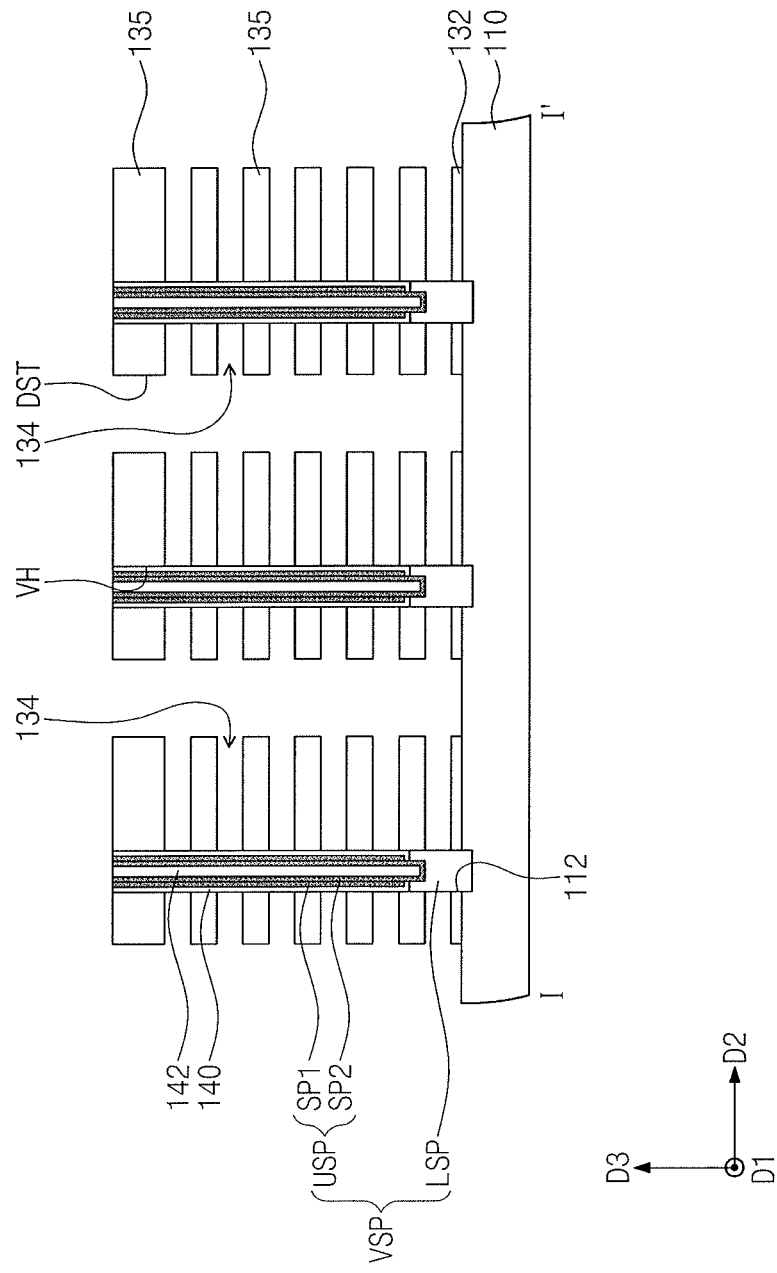

Referring to FIGS. 3 and 5G, the sacrificial patterns 138 of FIG. 5F exposed through the device isolation trenches DST may be selectively removed to form gate regions 134. The gate regions 134 may correspond to empty regions formed by selectively removing the sacrificial patterns 138 and may be defined by the data storage structures 140 and the insulating patterns 135. When the sacrificial patterns 138 include silicon nitride or silicon oxynitride, the removal of the sacrificial patterns 138 may be performed using an etching solution including phosphoric acid. Portions of the data storage structure 140 and a portion of the lower semiconductor pattern LSP may be exposed through the gate regions 134.

Figure 5H:
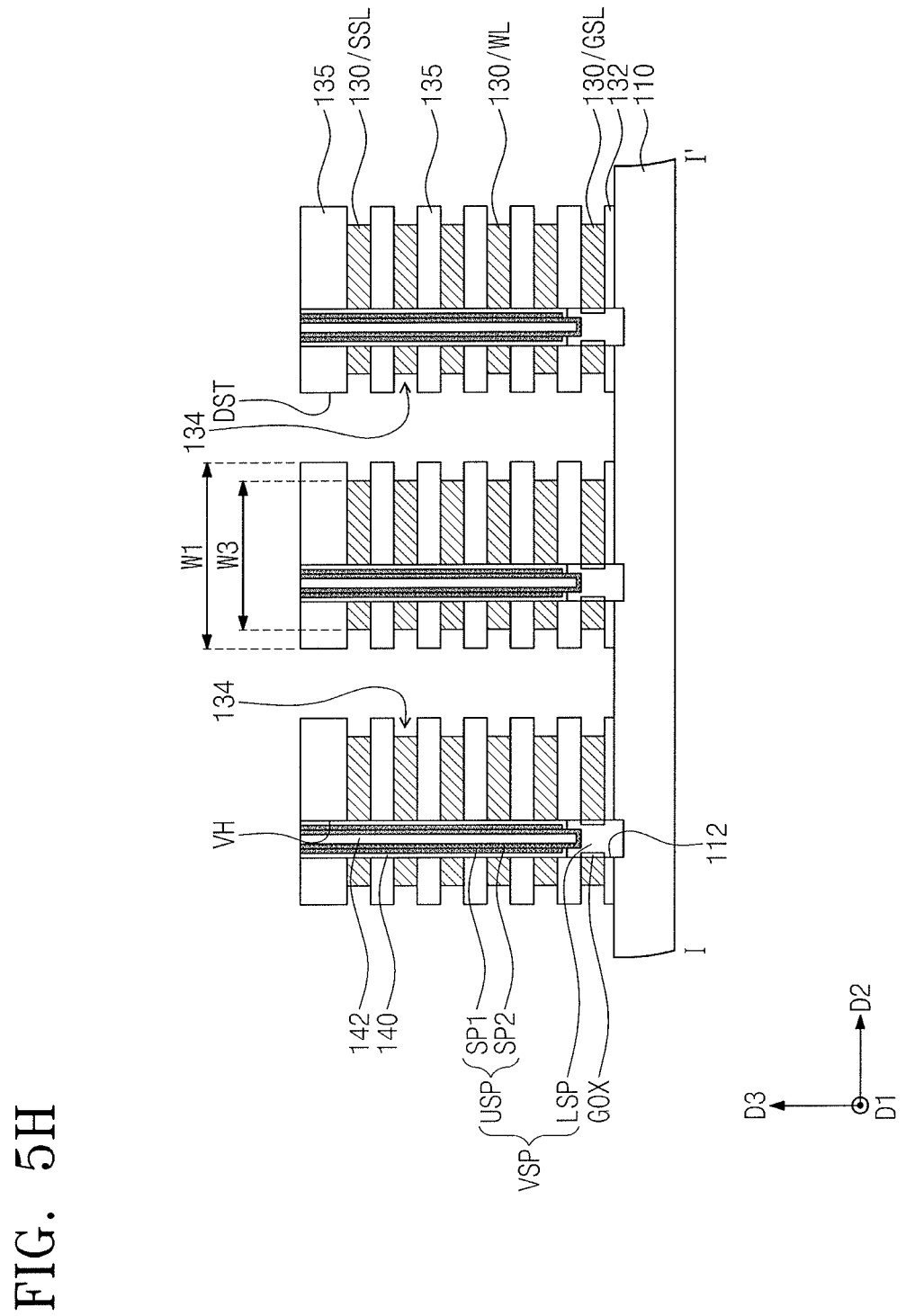

Referring to FIGS. 3 and 5H, the lower semiconductor pattern LSP exposed by the gate region 134 may be thermally oxidized to form a gate insulating layer GOX.

A conductive layer may be formed in the gate regions 134 through the device isolation trenches DST. The conductive layer may be formed using a CVD process or an ALD process. The conductive layer may include a conductive material, e.g., tungsten (W). The conductive layer may fill the gate regions 134 and may extend onto sidewalls and bottom surfaces of the device isolation trenches DST.

Even though not shown in drawings, according to some embodiments, an additional blocking insulating layer (not shown) may be formed on the insulating patterns 135 and the data storage structure 140 exposed through the gate regions 134 before the formation of the conductive layer. The additional blocking insulating layer may be formed by a CVD process or an ALD process. The additional blocking insulating layer may include a silicon oxide layer or a high-k dielectric layer (e.g., an aluminum oxide layer and/or a hafnium oxide layer).

A portion of the conductive layer may be removed to form conductive patterns 130 in the gate regions 134, respectively. The removed portion of the conductive layer may include a first portion formed outside the gate regions 134 (e.g., formed in the device isolation trenches DST), and second portions disposed in the gate regions 134 and adjacent to the device isolation trenches DST. The conductive layer formed in the device isolation trenches DST may be removed to expose the substrate 110 under the device isolation trenches DST. The portion of the conductive layer may be removed using a wet etching process.

The conductive patterns 130 may be spaced apart from each other by the insulating patterns 135. The conductive patterns 130 and the insulating patterns 135 may be alternately stacked. Widths W3 in the second direction D2 of the conductive patterns 130 may be smaller than widths W1 in the second direction D2 of the insulating patterns 135. In other words, each of the conductive patterns 130 may partially fill each of the gate regions 134. Thus, sidewalls of the device isolation trench DST, which include sidewalls of the conductive patterns 130 and sidewalls of the insulating patterns 135, may have uneven shapes. In other words, both sidewalls of each of the conductive patterns 135 may be laterally recessed from both sidewalls of the insulating patterns 135, and thus undercut regions may be formed at both sides of each of the conductive patterns 150.

The lowermost conductive pattern 130/GSL may correspond to a ground selection line, and the uppermost conductive pattern 130/SSL may correspond to a string selection line. The conductive patterns 130/WL disposed between the ground and string selection lines may correspond to word lines.

Figure 5I:
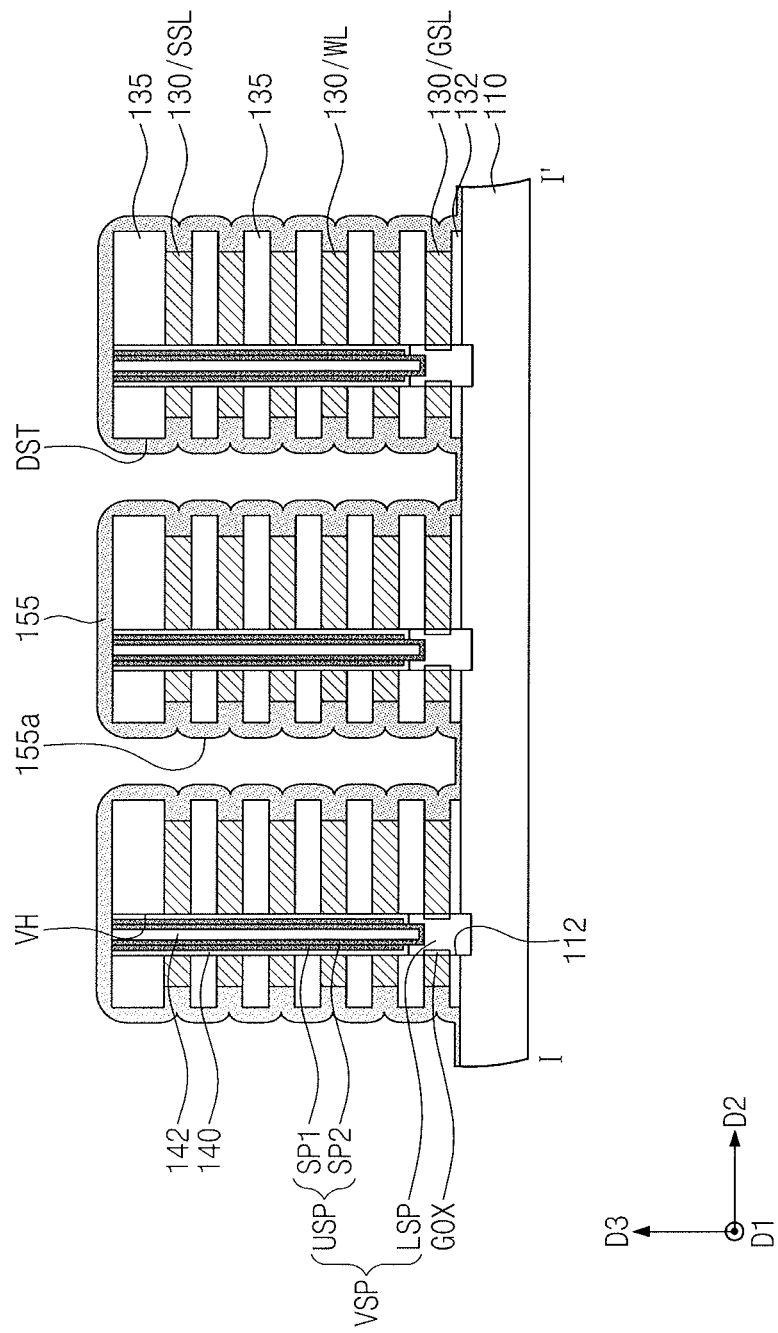

Referring to FIGS. 3 and 5I, an etching prevention layer 155 may be formed on the structure described with reference to FIGS. 3 and 5H. The etching prevention layer 155 may be formed on the sidewalls of the conductive patterns 130 to fill empty parts, not filled with the conductive patterns 130, of the gate regions 134. In other words, the etching prevention layer 155 may be formed to fill the undercut regions at both sides of each of the conductive patterns 150. In addition, the etching prevention layer 155 may extend onto the sidewalls of the insulating patterns 135. Moreover, the etching prevention layer 155 may further extend onto the top surface of the uppermost insulating pattern 135 and the top surface of the substrate 110 exposed by the device isolation trenches 135.

The etching prevention layer 155 may have an uneven sidewall 155a on the sidewalls of the device isolation trenches DST which include the sidewalls of the conductive patterns 130 and the sidewalls of the insulating patterns 135. This may be because the sidewalls of the conductive patterns 130 may be laterally recessed from the sidewalls of the insulating patterns 135.

For example, the etching prevention layer 155 may be formed of silicon or silicon nitride. The etching prevention layer 155 may be formed using a CVD process or an ALD process. A source gas supplied for the formation of the etching prevention layer 155 may not include oxygen. Thus, the etching prevention layer 155 may be formed directly on (or in contact with) the sidewalls of the conductive patterns 130 while preventing the conductive patterns 130 from being oxidized. For example, even though the conductive patterns 130 include tungsten (W), it is possible to prevent the conductive patterns 130 from being oxidized in the process of forming the etching prevention layer 155.

Figure 5J:
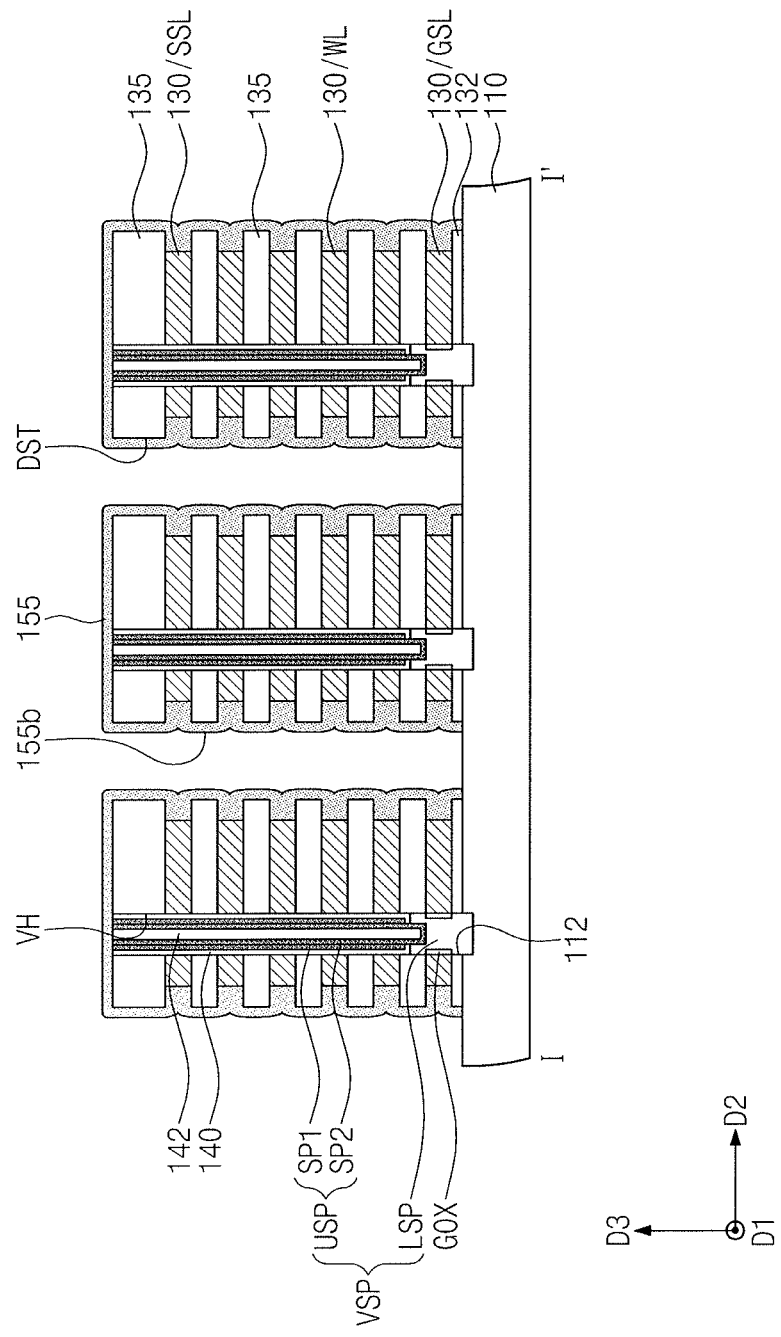

Referring to FIGS. 3 and 5J, a trimming process may be performed on the etching prevention layer 155, and thus, a thickness of the etching prevention layer 155 may be reduced. In addition, uneven degree (or roughness) of a sidewall 155b of the etching prevention layer 155 may be relaxed. In other words, the uneven degree of the sidewall 155b of the etching prevention layer 155 after the trimming process may be lower than that of the sidewall (155a of FIG. 5I) of the etching prevention layer 155 before the trimming process. In some embodiments, the portions of the substrate 110 vertically overlapping with the device isolation trenches DST may be exposed by the trimming process. Performing the trimming process may include performing, for example, a wet etching process or a dry etching process.

Figure 5K:
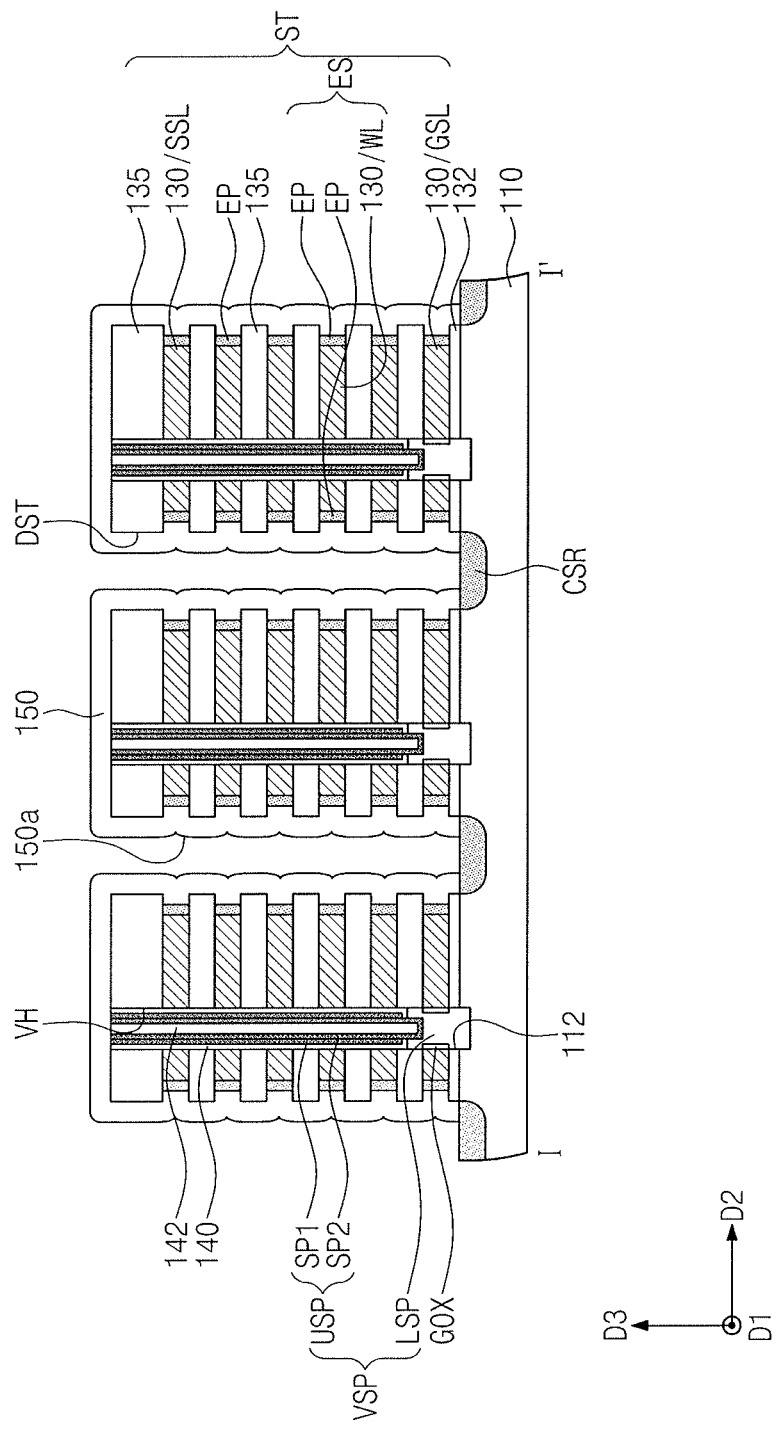

Referring to FIGS. 3 and 5K, etching prevention patterns EP and a first device isolation layer 150 may be formed.

The etching prevention patterns EP may be locally formed on the sidewalls of the conductive patterns 130 and may not extend onto the sidewalls of the insulating patterns 135. Thus the etching prevention patterns EP may be spaced apart from each other. The etching prevention patterns EP may be formed from the etching prevention layer 155, so the etching prevention patterns EP may include the same material as the etching prevention layer 155. For example, the etching prevention patterns EP may be formed of silicon or silicon nitride. One conductive pattern 130 and a pair of the etching prevention patterns EP formed on the sidewalls of the one conductive pattern 130 may constitute an electrode structure ES. Each of the electrode structures ES may be disposed between a pair of the insulating patterns 135 vertically adjacent to each other. The buffer dielectric pattern 132, the electrode structures ES, and the insulating patterns 130, which are stacked on the substrate 110, may constitute a stack structure ST. The stack structure ST may be provided in plurality on the substrate 110.

The first device isolation layer 150 may cover a surface of the stack structure ST. For example, the first device isolation 150 may cover the sidewalls of the etching prevention patterns EP and the sidewalls of the insulating patterns 135. The first device isolation layer 150 may be spaced apart from the conductive patterns 130 with the etching prevention patterns EP interposed therebetween. A portion of the first device isolation layer 150 may be inserted into between the insulating patterns 135 vertically adjacent to each other and may be in contact with the etching prevention pattern EP. The first device isolation layer 150 may include silicon oxide.

According to some embodiments, forming the etching prevention patterns EP and the first device isolation layer 155 may include oxidizing a portion of the etching prevention layer 150. The oxidized portion of the etching prevention layer 155 may correspond to the first device isolation 150, and unoxidized portions of the etching prevention layer 155 may correspond to the etching prevention patterns EP. The oxidation process may be performed until portions of the etching prevention layer 155 disposed on the sidewalls of the insulating patterns 135 are oxidized to separate the etching prevention patterns EP from each other. According to the present embodiment, since portions of the etching prevention layer 155 adjacent to the conductive patterns 130 are not oxidized, the conductive patterns 130 may also not be oxidized. In the present embodiment, the first device isolation layer 150 may have sidewalls 150a of which uneven degrees are relaxed, like the etching prevention layer 155 of FIG. 5J after the trimming process. This may be because the first device isolation layer 150 is formed by oxidizing the portion of the etching prevention layer 155 after the trimming process.

According to some other embodiments, the etching prevention patterns EP may be formed by wet-etching a portion of the etching prevention layer 155. In this case, an etch stop layer (not shown) may be formed on the exposed substrate 110 before the wet etching process. The wet etching process may be performed until the sidewalls of the insulating patterns 135 are exposed to separate the etching prevention patterns EP from each other. The first device isolation layer 150 may be formed by depositing a silicon oxide layer on the stack structures ST. For example, the silicon oxide layer of the first device isolation layer 150 may cover outer sidewalls of the etching prevention patterns EP and the sidewalls of the insulating patterns 135. The deposition process of the silicon oxide layer may be performed at a high temperature of, for example, about 100 degrees Celsius to about 900 degrees Celsius. The etching prevention patterns EP may be formed on the sidewalls of the conductive patterns 130, and thus the sidewalls of the conductive patterns 130 may not be exposed. As a result, the conductive patterns 130 may not be oxidized during the deposition process of the silicon oxide layer. In the present embodiment, the first device isolation layer 150 may have sidewalls 150a of which uneven degrees are lower than that of the sidewall (155a of FIG. 5I) of the etching prevention layer 155 before the trimming process. This may be because the etching prevention patterns EP are formed on the sidewalls of the conductive patterns 130 to reduce lateral depths of the undercut regions disposed at both sides of each of the conductive pattern 130.

A common source region CSR may be formed in an upper portion of the substrate 110 exposed through each of the device isolation trenches DST. The common source regions CSR may have a substantially uniform depth. The common source regions CSR may be formed by doping the substrate 110 exposed by the device isolation trenches DST with dopants.

Figure 5L:
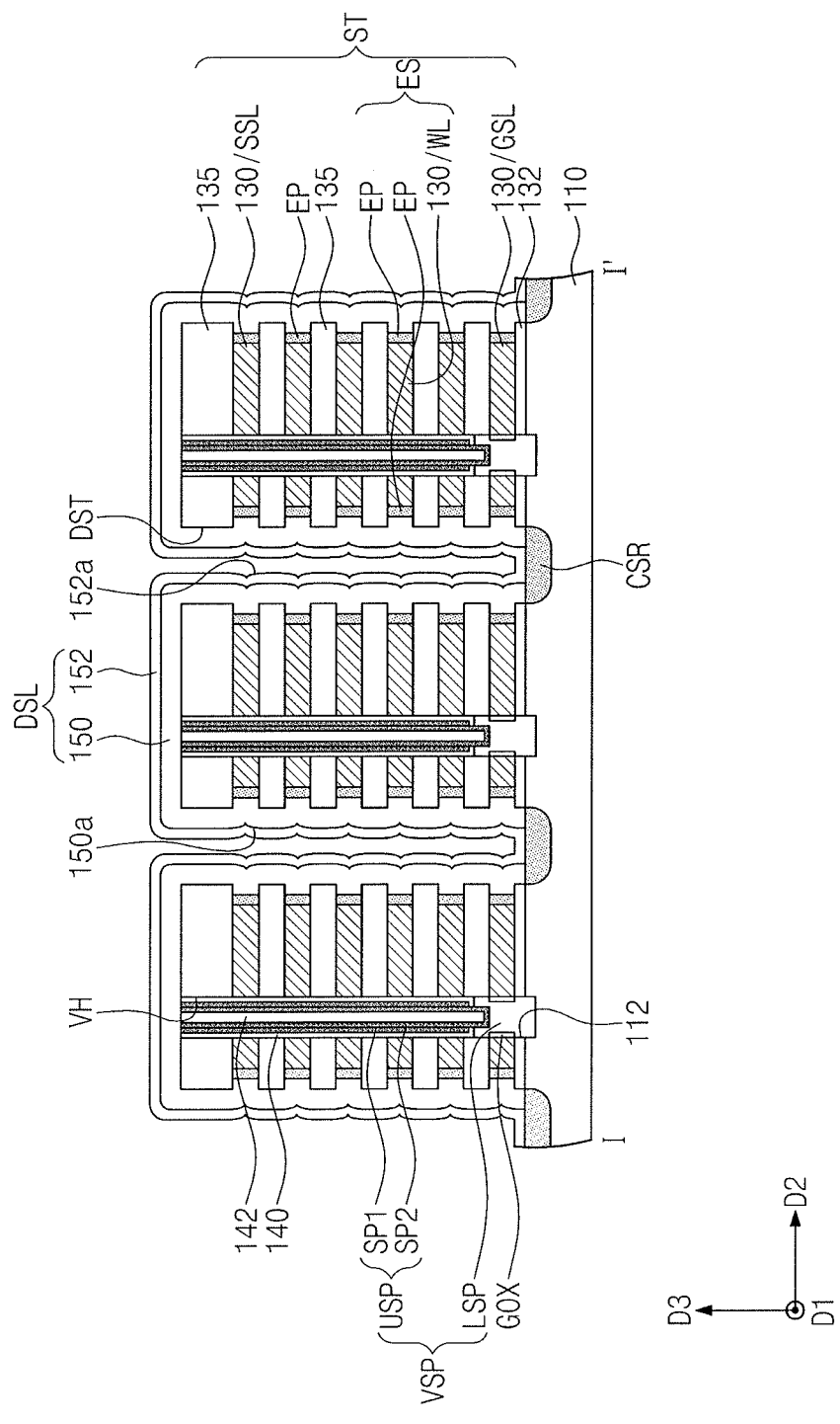

Referring to FIGS. 3 and 5L, a second device isolation layer 152 may be formed on the first device isolation layer 150. The second device isolation layer 152 may extend onto the exposed top surface of the substrate 110. The second device isolation layer 152 may have sidewalls 152a of which uneven degrees are relaxed. This may be because the second device isolation layer 152 is formed on the sidewalls 150a of the first device isolation layer 150 having the relaxed uneven degrees. The second device isolation layer 152 may include silicon oxide. The second device isolation layer 152 may be formed using a CVD process or an ALD process. The first and second device isolation layers 150 and 152 may constitute a device isolation layer DSL. According to some embodiment, the formation of the second device isolation layer 152 may be omitted.

Figure 5M:
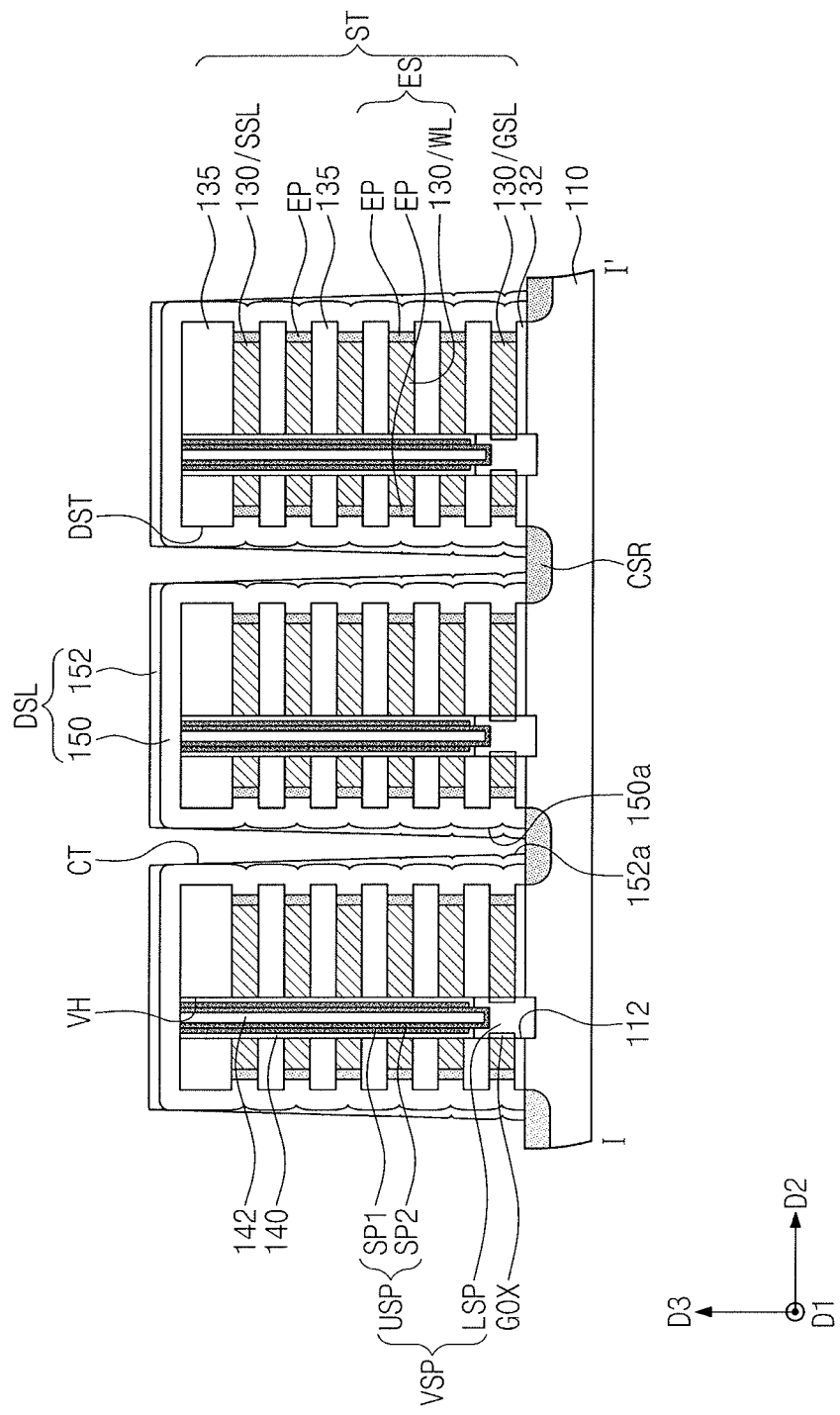

Referring to FIGS. 3 and 5M, portions of the device isolation layer DSL may be etched to form contact trenches CT exposing the common source regions CSR, respectively. Forming the contact trenches CT may include anisotropically etching the device isolation layer DSL. A width of the contact trench CT may become progressively less toward the substrate 110. This may be because etching of the anisotropic etching process may be difficult as a depth of the contact trench CT increases.

According to some embodiment, as illustrated in FIG. 5M, a lower portion of a sidewall of the contact trench CT may consist of the sidewall 152a of the second device isolation layer 152. In this case, the lower portion of the sidewall of the contact trench CT may be uneven.

Alternatively, the lower portion of the sidewall of the contact trench CT may be even unlike FIG. 5M.

Figure 5N:
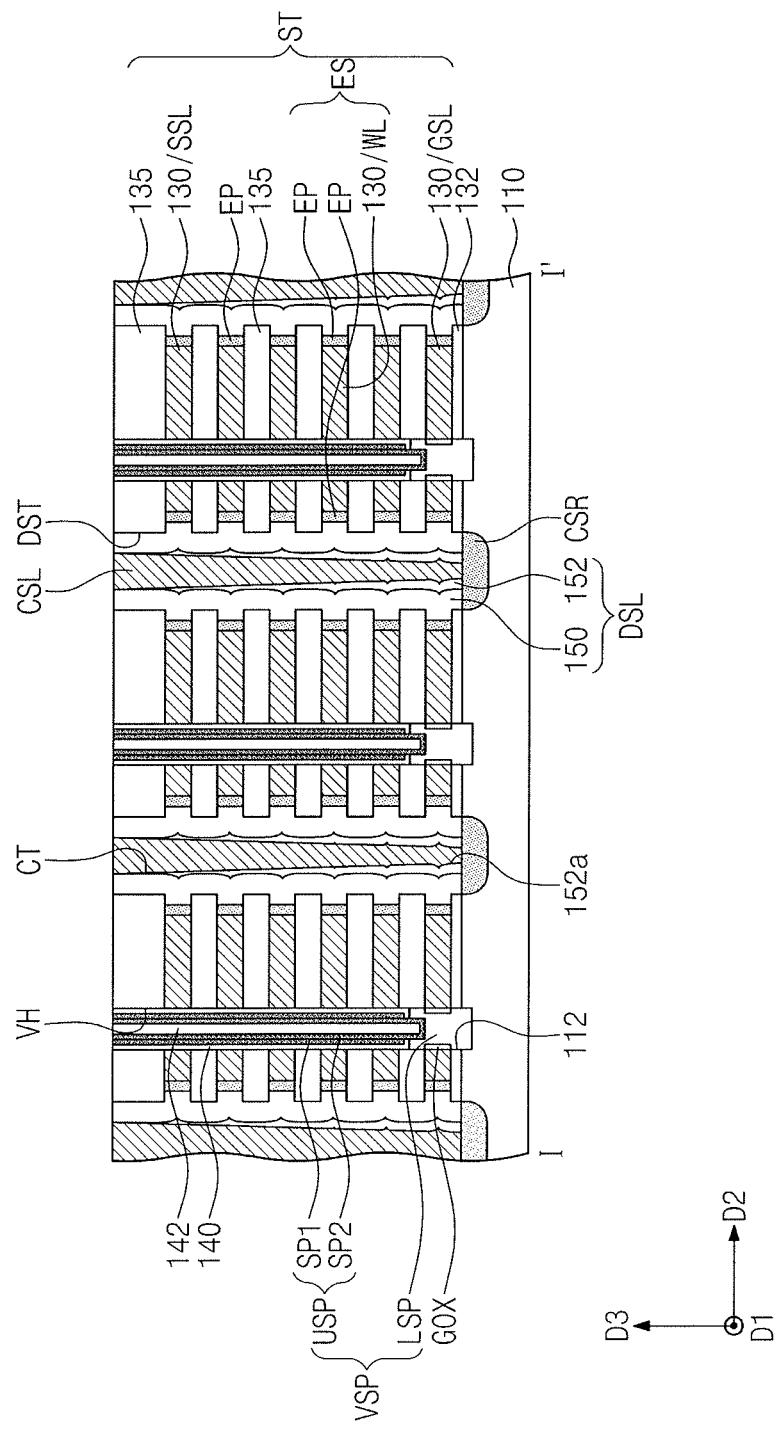
Figure 50:
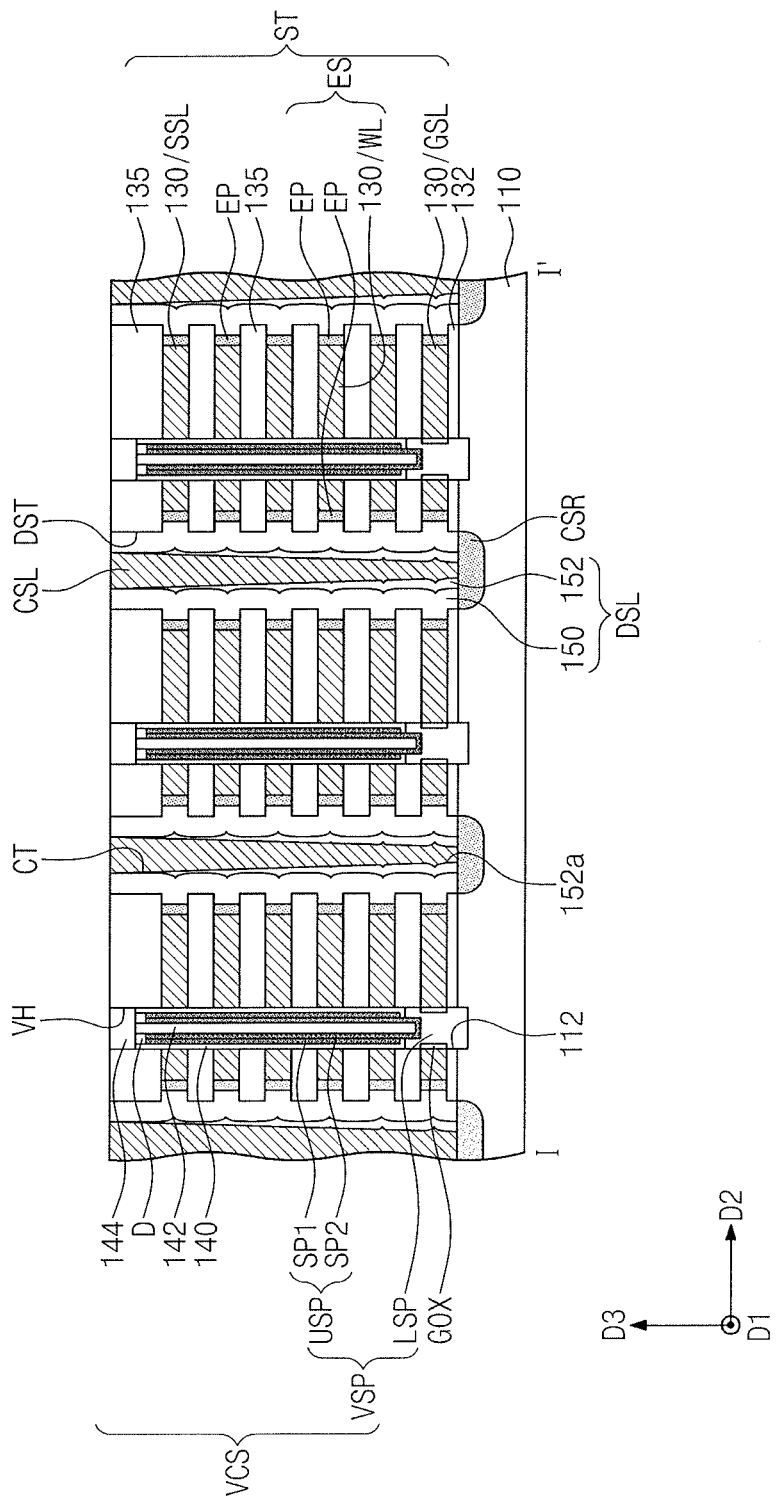

Referring to FIGS. 3 and 5N, common source lines CSL may be formed to fill the contact trenches CT, respectively. Forming the common source lines CSL may include forming a conductive layer filling the contact trenches CT and planarizing the conductive layer until the top surface of the uppermost insulating pattern 135 is exposed. The device isolation layer DSL on the top surface of the uppermost insulating pattern 135 may also be planarized by the planarization process.

Generally, a seam may be generated in the common source lines CSL when the sidewalls of the contact trenches CT are uneven. Generation probability of the seam may increase as the uneven degree of the sidewalls of the contact trenches CT increases. In the method for fabricating the semiconductor device according to embodiments, even though the lower portion of the sidewall of the contact trench CT consists of the sidewall 152a of the second device isolation layer 152, the sidewall 152a of the second device isolation layer 152 may have the relaxed uneven degree to inhibit the seam from being generated in the common source lines CSL.

Referring to FIGS. 3 and 5O, top ends of the upper semiconductor pattern USP, the data storage structure 140, and the filling insulator 142 may be recessed. A drain region D may be formed by doping an upper portion of the recessed upper semiconductor pattern USP with dopants. A conductive pad 144 may be formed in the recessed region. The conductive pad 144 may include, for example, doped polycrystalline silicon or a metal. The lower semiconductor pattern LSP, the upper semiconductor pattern USP, the data storage structure 140, the filling insulator 142, the conductive pad 144, and the drain region D may constitute a vertical channel structure VCS.

Referring again to FIGS. 3 and 4A, an interlayer insulating layer 160 may be formed to cover the stack structures ST, the common source lines CSL, and device isolation layers DSL. The interlayer insulating layer 160 may be formed using a physical vapor deposition (PVD) process, a CVD process, or an ALD process. For example, the interlayer insulating layer 160 may include at least one of silicon oxide, silicon nitride, or silicon oxynitride.

Contact plugs 170 may be formed to penetrate the interlayer insulating layer 160. The contact plugs 170 may be electrically connected to the vertical channel structures VCS. The bit line BL may be formed on the interlayer insulating layer 160 to intersect the stack structures ST. Forming the bit line BL may include forming a conductive layer on the interlayer insulating layer 160 and patterning the conductive layer.

Generally, hydrofluoric acid (HF) may be generated in the process of forming the conductive pattern 130 including tungsten. For example, when the tungsten layer is formed, tungsten hexafluoride ($WF_6$) and hydrogen ($H_2$) which are used as source gases may react with each other to generate a hydrofluoric acid (HF) gas. The hydrofluoric acid (HF) may be trapped in the conductive pattern 130 and may be then diffused into the device isolation layer DSL, and thus the device isolation layer DSL may be etched by the hydrofluoric acid (HF). In addition, a general device isolation layer including silicon oxide may be formed by a low-temperature (e.g., a room temperature) deposition process to prevent the conductive patterns 130 from being oxidized. Thus, the general device isolation layer may have a weak characteristic with respect to hydrofluoric acid, i.e., the general device isolation layer may be easily etched by hydrofluoric acid.

In the method for fabricating the semiconductor device according to embodiments, the device isolation layer DSL may be spaced apart from the conductive pattern 130 with the etching prevention patterns EP interposed therebetween. The etching prevention patterns EP may be formed of a material having a high etch resistance with respect to hydrofluoric acid (HF) (i.e., a material having a low etch rate with respect to the hydrofluoric acid (HF)), and thus it is possible to inhibit the hydrofluoric acid (HF) trapped in the conductive pattern 130 from being diffused into the device isolation layer DSL. In addition, the device isolation layer DSL including silicon oxide may be formed by oxidizing a silicon layer or by the high-temperature deposition process. Thus, it is possible to form the device isolation layer DSL having the high etch resistance with respect to hydrofluoric acid. In other words, the device isolation lay DSL may be hardly etched by hydrofluoric acid. As a result, reliability of the semiconductor device according to embodiments may be improved.

Figure 6:
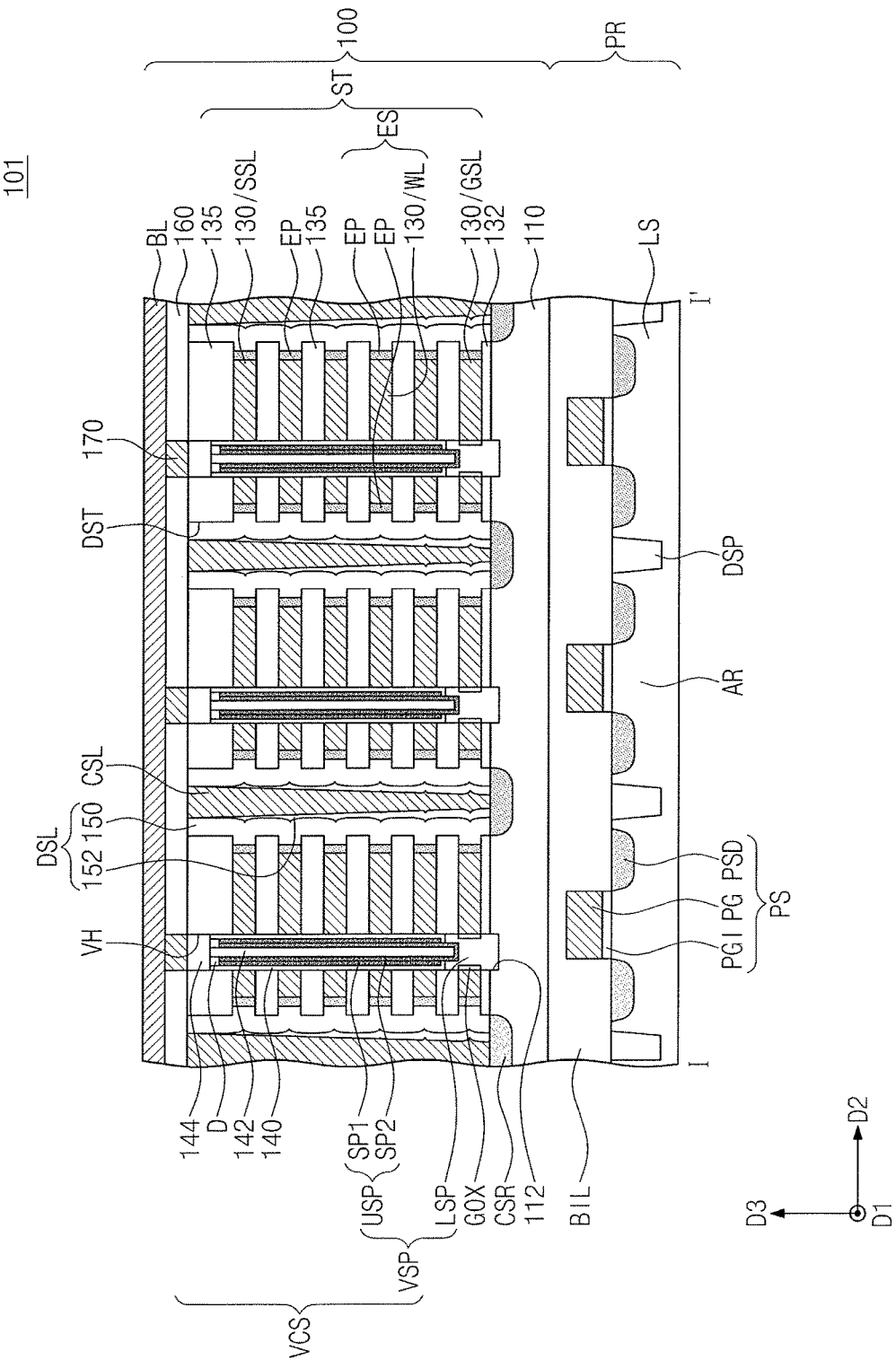
FIG. 6 is a cross-sectional view corresponding to the line I-I' of FIG. 3 to illustrate a semiconductor device according to embodiments.

FIG. 6 is a cross-sectional view corresponding to the line I-I' of FIG. 3 to illustrate a semiconductor device according to embodiments.

Referring to FIGS. 3 and 6, a semiconductor device 101 may include a peripheral circuit region PR and a semiconductor device 100 provided on the peripheral circuit region PR. The semiconductor device 100 may be the substantially same as the semiconductor device 100 described with reference to FIGS. 3, 4A, and 4B, so the descriptions to the semiconductor device 100 may be omitted.

The peripheral circuit region PR may include a lower substrate LS, peripheral circuit structures PS, and a lower interlayer insulating layer BIL.

The lower substrate LS may be a semiconductor substrate. For example, the semiconductor substrate may include a single-crystalline silicon layer, a silicon layer formed on a silicon-germanium (SiGe) layer, a single-crystalline silicon layer formed on an insulating layer, or a poly-crystalline semiconductor layer formed on an insulating layer. Device isolation patterns DSP may be provided in the lower substrate LS to define active regions AR.

The peripheral circuit structure PS may include a gate electrode PG, a gate insulating layer PGI disposed between the gate electrode PG and the lower substrate LS, and source/drain regions PSD disposed at both sides of the gate electrode PG. The gate electrode PG may be disposed on the active region AR of the lower substrate LS, and the gate insulating layer PGI may be disposed between the gate electrode PG and the active region AR. The source/drain regions PSD may be provided in the active region AR at both sides of the gate electrode PG and may be regions doped with N-type or P-type dopants. The gate electrode PG, the active region AR under the gate electrode PG, and the source/drain regions PSD may constitute a transistor.

The lower interlayer insulating layer BIL may cover the peripheral circuit structure PS and the lower substrate LS. A top surface of the lower interlayer insulating layer BIL may be planarized. The lower interlayer insulating layer BIL may include at least one of, but not limited to, silicon oxide, silicon nitride, or silicon oxynitride.

Figure 7:
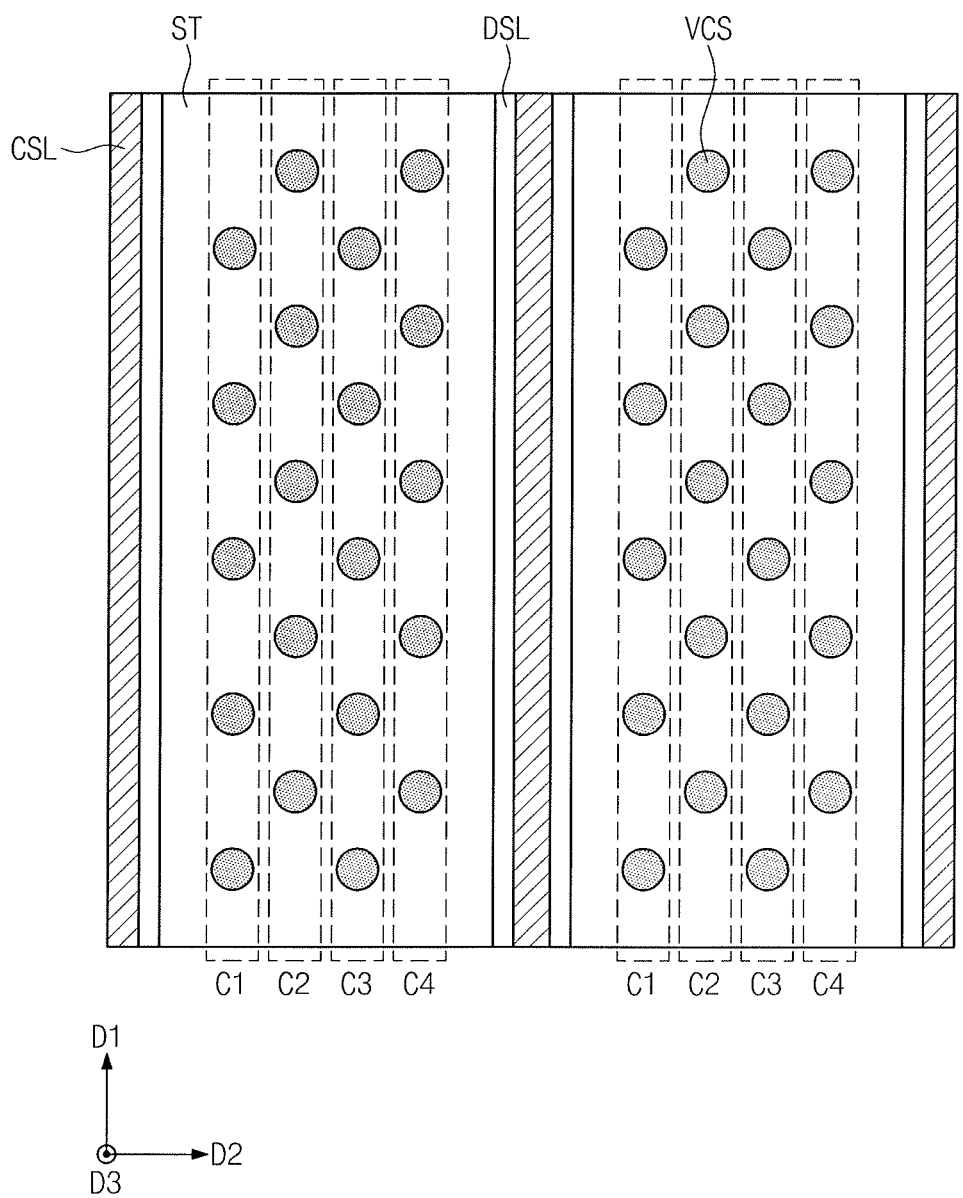
FIG. 7 is a plan view illustrating a semiconductor device according to embodiments.

FIG. 7 is a plan view illustrating a semiconductor device according to embodiments. In the present embodiment, the same elements as described in the embodiment of FIGS. 3, 4A, and 4B will be indicated by the same or similar reference numerals or the same or similar reference designators. For the purpose of ease and convenience in explanation, the descriptions to the same elements as in the embodiment of the FIGS. 3, 4A, and 4B will be omitted or mentioned briefly.

Referring to FIG. 7, a semiconductor device 102 may include a substrate, stack structures ST, vertical channel structures VCS, common source lines CSL, and device isolation layers DSL. The substrate, the stack structures ST, the common source lines CSL, and the device isolation layers DSL may be the substantially same as described with reference to FIGS. 3, 4A, and 4B, and thus the descriptions thereto will be omitted.

As illustrated in FIG. 7, the vertical channel structures VCS penetrating one stack structure ST defined by the device isolation layers DSL may be arranged along four columns C1 to C4 parallel to the first direction D1 when viewed from a plan view. In addition, the vertical channel structures VCS constituting adjacent two of the columns C1 to C4 may be arranged in a zigzag form along the first direction D1 when viewed from a plan view. Each of the vertical channel structures VCS may be the substantially same as the vertical channel structure VCS described with reference to FIGS. 3, 4A, and 4B.

Figure 8:
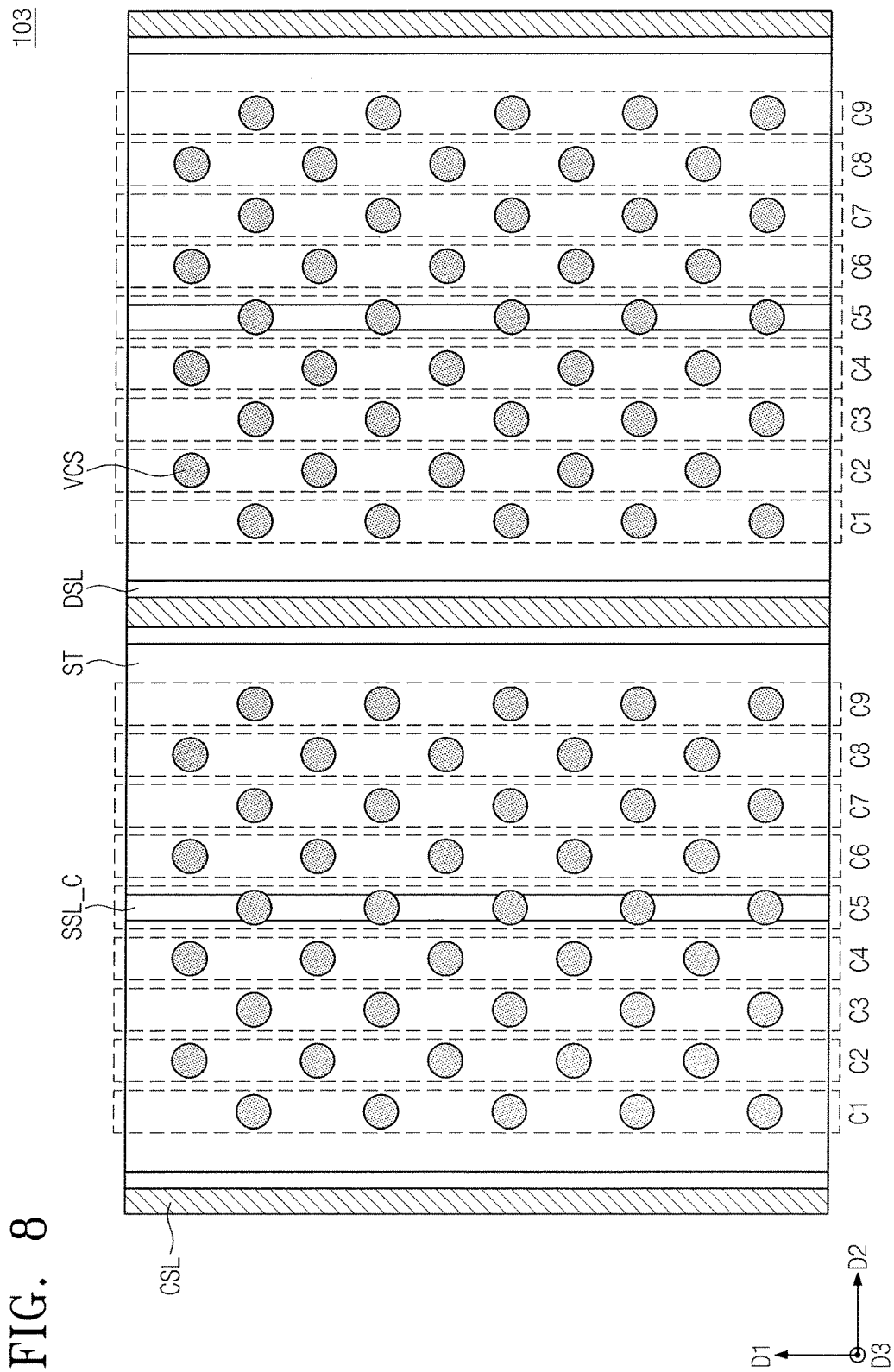
FIG. 8 is a plan view illustrating a semiconductor device according to embodiments.

FIG. 8 is a plan view illustrating a semiconductor device according to embodiments. In the present embodiment, the same elements as described in the embodiment of FIGS. 3, 4A, and 4B will be indicated by the same or similar reference numerals or the same or similar reference designators. For the purpose of ease and convenience in explanation, the descriptions to the same elements as in the embodiment of the FIGS. 3, 4A, and 4B will be omitted or mentioned briefly.

Referring to FIG. 8, a semiconductor device 103 may include a substrate, stack structures ST, vertical channel structures VCS, common source lines CSL, and device isolation layers DSL. The substrate, the common source lines CSL, and the device isolation layers DSL may be the substantially same as described with reference to FIGS. 3, 4A, and 4B, and thus the descriptions thereto will be omitted.

As illustrated in FIG. 8, the vertical channel structures VCS penetrating one stack structure ST may be arranged along nine columns C1 to C9 parallel to the first direction D1 when viewed from a plan view. In addition, the vertical channel structures VCS constituting adjacent two of the columns C1 to C9 may be arranged in a zigzag form along the first direction D1 when viewed from a plan view. Each of the vertical channel structures VCS may be the substantially same as the vertical channel structure VCS described with reference to FIGS. 3, 4A, and 4B. The vertical channel structures VCS constituting a fifth column C5 may be dummy vertical channel structures which are not connected to the bit line. The vertical channel structures VCS constituting the other columns C1 to C4 and C6 to C9 may be active vertical channel structures connected to the bit lines.

Each of the stack structures ST may include electrode structures and insulating patterns alternately and repeatedly stacked, and a string selection line separation pattern SSL_C. The electrode structures and the insulating patterns may be the substantially same as described with reference to FIGS. 3, 4A, and 4B. In a plan view, the string selection line separation pattern SSL_C may extend in the first direction D1 and may be connected to the vertical channel structures VCS constituting the fifth column C5. The string selection line separation pattern SSL_C may be provided in an upper portion of each of the stack structures ST to divide the conductive pattern (i.e., the string selection line) included in the uppermost electrode structure into sub-string selection lines separated from each other in the second direction D2. The string selection line separation pattern SSL_C may not divide the conductive patterns included in other electrode structures.

Figure 9:
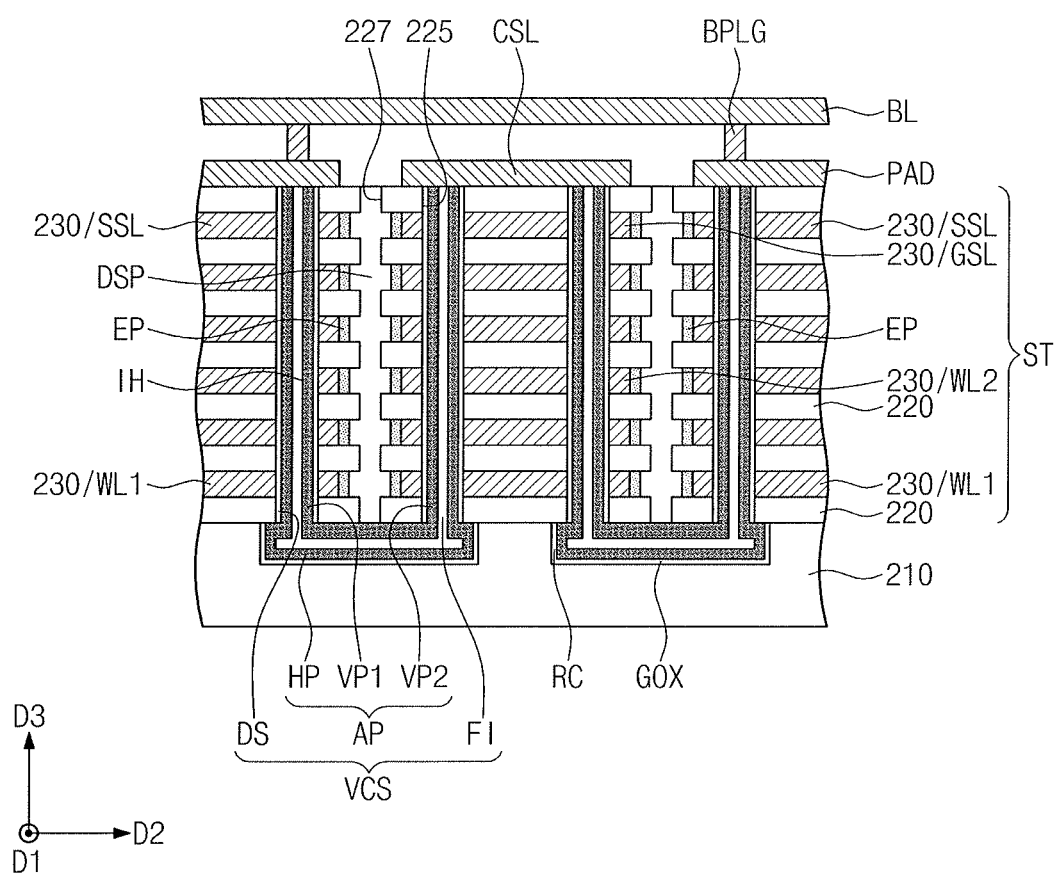
FIG. 9 is a cross-sectional view illustrating a semiconductor device according to embodiments.

FIG. 9 is a cross-sectional view illustrating a semiconductor device according to embodiments.

Referring to FIG. 9, a semiconductor device 200 may include a substrate 210, bit lines BL on the substrate 210, stack structures ST between the substrate 210 and the bit lines BL, a common source line CSL between the stack structures ST and the bit lines BL, and vertical channel structures VCS penetrating the stack structures ST.

Each of the stack structures ST may include a plurality of insulating patterns 220 and a plurality of conductive patterns 230 alternately stacked. In addition, each of the stack structures ST may further include etching prevention patterns EP locally disposed on sidewalls of the conductive patterns 230. The etching prevention patterns EP may be spaced apart from each other and may be disposed between the insulating patterns 220. Sidewalls of the insulating patterns 220 may be exposed by the etching prevention patterns EP. Each of the stack structures ST may extend in a first direction D1. The stack structures ST may be spaced apart from each other in a second direction D2 intersecting (e.g., perpendicular to) the first direction D1 by device isolation trenches 227 extending in the first direction D1.

The conductive patterns 230 may include a conductive material (e.g., tungsten), and the insulating patterns 220 may include silicon oxide. The etching prevention patterns EP may include a material, an etch rate of which is lower than that of a device isolation pattern DSP, to be described later, with respect to hydrofluoric acid. Thus, the etch rate of the etching prevention patterns EP by the hydrofluoric acid may be lower than the etch rate of the device isolation pattern DSP by the hydrofluoric acid. For example, the etching prevention patterns EP may be formed of silicon or silicon nitride.

The conductive patterns 230 may be sequentially stacked on the substrate 210 in a third direction D3 perpendicular to the top surface of the substrate 210. The conductive patterns 230 may include a string selection line SSL, word lines WL, and a ground selection line GSL. The string selection line SSL may be disposed between the word lines WL and the bit lines BL. The ground selection line GSL may be disposed between the word lines WL and the common source line CSL. The word lines WL may be vertically stacked on the substrate 210 along the third direction D3 (as the conductive patterns), as illustrated in FIG. 9. The string selection line SSL and the ground selection line GSL may be disposed on the word lines WL. The string selection line SSL and the ground selection line GSL may be spaced apart from each other in the second direction D2 by the device isolation trench 227. The word lines WL may include upper word lines WL1 disposed between the substrate 210 and the string selection line SSL, and lower word lines WL2 disposed between the substrate 210 and the ground selection line GSL. The upper word lines WL1 may be spaced apart from the lower word lines WL2 in the second direction D2 by the device isolation trench 227.

A device isolation pattern DSP may be provided between the string selection line SSL and the ground selection line GSL and between the upper word lines WL1 and the lower word lines WL2. The device isolation pattern DSP may extend in the first direction D1. For example, the device isolation pattern DSP may fill the device isolation trench 227. The etching prevention patterns EP may be disposed between the device isolation pattern DSP and the conductive patterns 230. Thus, the device isolation pattern DSP may be spaced apart from the conductive patterns 130 with the etching prevention patterns EP interposed therebetween. The device isolation pattern DSP may include silicon oxide. In an embodiment, the device isolation pattern DSP may include a silicon oxide layer formed by oxidizing silicon or a silicon oxide layer deposited at a high temperature of, for example, about 100 degrees Celsius to about 900 degrees Celsius.

A plurality of active pillars AP may penetrate the stack structures ST. The active pillars AP may be arranged along the first direction D1 when viewed from a plan view.

The active pillar AP may connect the bit line BL to the common source line CSL. A bit line plug PLG and a pad PAD for electrical connection between the active pillar AP and the bit line BL may be disposed between the stack structure ST and the bit line BL.

Each of the active pillars AP may include a pair of vertical portions VP1 and VP2 penetrating stack structures ST vertically along the third direction D3, and a horizontal portion along the second direction D2 disposed under the stack structures ST to connect the vertical portions VP1 and VP2 to each other, as illustrated in FIG. 9. The vertical portions VP1 and VP2 may be provided in vertical holes 225 penetrating the stack structures ST. The horizontal portion HP may be provided in a horizontal recess part RC formed in an upper portion of the substrate 210. One of the pair of vertical portions VP1 and VP2 may be connected to the common source line CSL, and the other of the pair of vertical portions VP1 and VP2 may be connected to the bit line BL. The horizontal portion HP may be provided between the substrate 210 and the stack structures ST to connect the pair of vertical portions VP1 and VP2 to each other.

For example, in each of the active pillars AP, the vertical portions VP1 and VP2 may include a first vertical portion VP1 penetrating the upper word lines WL1 and the string selection line SSL and a second vertical portion VP2 penetrating the lower word lines WL2 and the ground selection line GSL. The first vertical portion VP1 may be connected to the bit line BL, and the second vertical portion VP2 may be connected to the common source line CSL. The horizontal portion HP may extend from under the upper word lines WL1 to under the lower word lines WL2 to connect the first vertical portion VP1 to the second vertical portion VP2.

A data storage layer DS may be provided between the active pillar AP and the conductive patterns 230. A gate insulating layer GOX may be disposed between the active pillar AP and the substrate 210. The gate insulating layer GOX may include a silicon oxide layer. The vertical portions VP1 and VP2 and the horizontal portion HP may have pipe or macaroni shapes, and an filling insulator FI may fill inner spaces of the vertical portions VP1 and VP2 and the horizontal portion HP. The active pillar AP, the data storage layer, and the filling insulator FI may constitute the vertical channel structure VCS.

In the semiconductor device according to embodiments, the device isolation layer may be spaced apart from the conductive patterns with the etching prevention patterns interposed therebetween. The etching prevention patterns may be formed of the material having the high etch resistance with respect to hydrofluoric acid (HF), and thus it is possible to inhibit hydrofluoric acid trapped in the conductive pattern from being diffused into the device isolation layer.

In the method for fabricating the semiconductor device according to embodiments, the device isolation layer including silicon oxide may be formed by oxidizing a silicon layer or by the high-temperature deposition process. Thus, the device isolation layer having a high resistance with respect to hydrofluoric acid may be formed.

While example embodiments have been described, it will be apparent to those skilled in the art that various changes and modifications may be made without departing from the spirits and scopes thereof. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A method for fabricating a semiconductor device, the method comprising:
    forming insulating patterns, conductive patterns, and vertical channel structures, the insulating patterns and the conductive patterns being alternately stacked on a substrate to define a plurality of stack structures spaced apart from each other along a first direction parallel to a top surface of the substrate, and the vertical channel structures penetrating the stack structures, respectively, along a second direction perpendicular to the top surface of the substrate;
    forming an etching prevention layer covering first sidewalls of the insulating patterns and first sidewalls of the conductive patterns, such that the etching prevention layer includes silicon or silicon nitride without oxygen;
    forming a common source line between adjacent ones of the plurality of stack structures, the common source line extending in parallel to the stack structures;
    forming a device isolation layer between the common source line and each one of the adjacent one of the plurality of stack structures; and
    forming a plurality of etching prevention patterns from the etching prevention layer, such that the plurality of etching prevention patterns are between the device isolation layer and the first sidewalls of the conductive patterns.

2. The method of claim 1, wherein the plurality of etching prevention patterns include the same material as the etching prevention layer.

3. The method of claim 1, wherein forming the plurality of etching prevention patterns and the device isolation layer includes oxidizing a portion of the etching prevention layer,
    wherein the oxidized portion of the etching prevention layer corresponds to the device isolation layer, and
    wherein unoxidized portions of the etching prevention layer correspond to the plurality of etching prevention patterns.

4. The method of claim 1, wherein:
    forming the plurality of etching prevention patterns includes wet-etching a portion of the etching prevention layer, and
    forming the device isolation layer includes depositing a silicon oxide layer covering the plurality of etching prevention patterns and the first sidewalls of the insulating patterns.

5. The method of claim 1, wherein widths of the conductive patterns are smaller than widths of the insulating patterns, and the plurality of etching prevention patterns are disposed between the insulating patterns.

6. The method of claim 5, wherein a portion of the device isolation layer is inserted between the insulating patterns.

7. The method of claim 1, further comprising trimming the etching prevention layer before forming the plurality of etching prevention patterns.

8. A semiconductor device, comprising:
    a plurality of stack structures extending in a first direction parallel to a top surface of a substrate and spaced apart from each other, each of the stack structures including insulating patterns and conductive patterns alternately stacked on the substrate;
    a plurality of vertical channel structures vertically penetrating the stack structures along a second direction perpendicular to the top surface of the substrate;
    a common source line between the stack structures that are adjacent to each other, the common source line extending in parallel to the stack structures;
    a device isolation layer between the common source line and each side of the stack structures; and
    a plurality of etching prevention patterns between the device isolation layer and sidewalls of the conductive patterns,
    wherein the plurality of etching prevention patterns include silicon or silicon nitride without oxygen.

9. The semiconductor device of claim 8, wherein the device isolation layer includes a different material from the plurality of etching prevention patterns.

10. The semiconductor device of claim 8, wherein the plurality of etching prevention patterns are spaced apart from each other in the second direction.

11. The semiconductor device of claim 8, wherein:
    the plurality of etching prevention patterns are between the device isolation layer and first sidewalls of the conductive patterns,
    each of the plurality of stack structures has the conductive patterns with the first sidewalls that face the plurality of etching prevention patterns, and the insulating patterns with first sidewalls that face the device isolation layer, and
    the first sidewalls of the insulating patterns are horizontally offset relatively to the first sidewalls of the conductive patterns to define recess regions between adjacent insulating patterns, the recess regions being horizontally adjacent to the plurality of etching prevention patterns and vertically spaced apart from each other, and the device isolation layer filling the recess regions.

12. The semiconductor device of claim 11, wherein:
    the insulating patterns and the conductive patterns in each of the plurality of stack structures further have second sidewalls opposite respective first sidewalls, the second sidewalls of the insulating patterns and of the conductive patterns being coplanar with each other and abutting against a corresponding vertical channel structure, and
    a width of each of the insulating patterns in the first direction in each of the plurality of stack structures being larger than a width of each of the conductive patterns adjacent thereto.

13. The semiconductor device of claim 8, wherein each of the plurality of etching prevention patterns is disposed between adjacent ones of the insulating patterns.

14. The semiconductor device of claim 8, wherein the conductive patterns are spaced apart from the device isolation layer.

15. The semiconductor device of claim 8, wherein an etch rate of the plurality of etching prevention patterns by a hydrofluoric acid (HF) is lower than an etch rate of the device isolation layer by the hydrofluoric acid (HF).

16. The semiconductor device of claim 8, wherein the conductive patterns include tungsten (W).

17. The semiconductor device of claim 8, further comprising a common source region in the substrate between the plurality of stack structures, the common source line being connected to the common source region.

18. The semiconductor device of claim 8, wherein the common source line is between two adjacent vertical channel structures of respective adjacent stack structures, each stack structure of the plurality of stack structures including a single vertical channel structure.

* * * * *